(12) United States Patent
Yu et al.

(10) Patent No.: US 12,527,161 B2
(45) Date of Patent: Jan. 13, 2026

(54) DISPLAY SUBSTRATE AND MANUFACTURING METHOD THEREOF AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Ziyang Yu, Beijing (CN); Zhiliang Jiang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 448 days.

(21) Appl. No.: 18/033,239

(22) PCT Filed: May 24, 2022

(86) PCT No.: PCT/CN2022/094625
§ 371 (c)(1),
(2) Date: Apr. 21, 2023

(87) PCT Pub. No.: WO2023/225837
PCT Pub. Date: Nov. 30, 2023

(65) Prior Publication Data
US 2024/0381691 A1    Nov. 14, 2024

(51) Int. Cl.
*H10K 59/121* (2023.01)
*H10K 59/12* (2023.01)
*H10K 59/88* (2023.01)

(52) U.S. Cl.
CPC ..... *H10K 59/1213* (2023.02); *H10K 59/1201* (2023.02); *H10K 59/88* (2023.02)

(58) Field of Classification Search
CPC . H10K 59/1201; H10K 59/1213; H10K 59/88
See application file for complete search history.

(56) References Cited

U.S. PATENT DOCUMENTS

2015/0102302 A1    4/2015   Kim et al.
2020/0365676 A1    11/2020  Lim et al.

FOREIGN PATENT DOCUMENTS

| CN | 207008253 U | 2/2018 |
|---|---|---|
| CN | 111477667 A | 7/2020 |
| CN | 111675547 A | 9/2020 |

(Continued)

*Primary Examiner* — Sardis F Azongha
(74) *Attorney, Agent, or Firm* — Scully, Scott, Murphy & Presser, P.C.

(57) ABSTRACT

A display substrate, a manufacturing method thereof and a display device are disclosed. The display substrate includes a display region, a peripheral region, a drive structure layer, a light-emitting structure layer and a peripheral circuit. The light-emitting structure layer includes a light-emitting structure array, and the driving structure layer includes a drive circuit array and a dummy circuit array. At least part of the dummy circuit array is configured to be removed from the drive structure layer, so that a circuit vacant region is formed on a side of the drive structure layer adjacent to the peripheral region, and the circuit vacant region is configured to accommodate at least part of the peripheral circuit.

20 Claims, 9 Drawing Sheets

(56) References Cited

FOREIGN PATENT DOCUMENTS

| | | | |
|---|---|---|---|
| CN | 111952338 | A | 11/2020 |
| CN | 113506539 | A | 10/2021 |
| CN | 113539130 | A | 10/2021 |
| CN | 113823214 | A | 12/2021 |
| KR | 20170078466 | A | 7/2017 |
| KR | 20170079854 | A | 7/2017 |
| KR | 20180014273 | A | 2/2018 |
| KR | 20180095773 | A | 8/2018 |
| KR | 20200046796 | A | 5/2020 |

DISPLAY SUBSTRATE AND MANUFACTURING METHOD THEREOF AND DISPLAY DEVICE

CROSS-REFERENCE TO RELATED APPLICATION

This application is a U.S. National Phase of International Application No. PCT/CN2022/094625, filed on May 24, 2022, the entire disclosure of which is incorporated herein by reference as part of the present application.

TECHNICAL FIELD

Embodiment of the present disclosure relates to a display substrate and a manufacturing method thereof, and a display device.

BACKGROUND

Display devices have developed rapidly in recent years, especially organic light emitting diode (OLEDs) displays have become a hot spot in the field of display research. Compared with liquid crystal displays (LCDs), the organic light-emitting diode OLED has the advantages of low energy consumption, low production cost, self-illumination, wide viewing angle and fast response speed, so it is widely used in display devices with display functions, such as smart phones, tablet computers, and displays.

SUMMARY

According to first aspect of the present disclosure, it is provided a display substrate, comprising: a display region and a peripheral region provided on at least one side of the display region, the display substrate comprising: a base substrate; a driving structure layer and a light-emitting structure layer, sequentially stacked on the base substrate and provided in the display region, the light-emitting structure layer comprising a light-emitting structure array, the driving structure layer comprising a drive circuit array and a dummy circuit array; and a peripheral circuit, on the base substrate and provided in the peripheral region, the peripheral circuit being connected to at least one of the light-emitting structure array and the drive circuit array; wherein at least part of the dummy circuit array is configured to be removed from the drive structure layer, such that a circuit vacant region is formed on a side of the drive structure layer adjacent to the peripheral region, and the circuit vacant region is configured to accommodate at least part of the peripheral circuit.

In some embodiments, the drive circuit array comprises a drive circuit subarray; the dummy circuit array comprises a dummy circuit subarray; the dummy circuit subarray is provided between the peripheral region and the drive circuit subarray in a direction parallel to the base substrate, wherein at least part of the dummy circuit subarray on a side being adjacent to the peripheral region is configured to be removed to form the circuit vacant region.

In some embodiments, the drive circuit array comprises a drive circuit subarray; the dummy circuit array comprises a dummy circuit subarray; the drive circuit subarray is provided between the peripheral circuit and the dummy circuit subarray in a direction parallel to the base substrate; wherein at least part of the dummy circuit subarray is configured to be removed; the drive circuit subarray is configured to be moved along the direction parallel to the base substrate and adjacent to the dummy circuit subarray, so that at least part of the drive circuit subarray replaces at least part of the dummy circuit subarray being removed, and the circuit vacant region is formed on the side of the drive structure layer adjacent to the peripheral region.

In some embodiments, the dummy circuit subarray comprises a plurality of lines of dummy circuits provided in the direction parallel to the base substrate, and the at least part of the dummy circuit subarray being removed comprises at least one line of dummy circuits in the plurality of columns of dummy circuits.

In some embodiments, the dummy circuit array comprises a plurality of dummy circuit subarrays provided in the direction parallel to the base substrate; wherein, in the plurality of dummy circuit subarrays, at least part of the dummy circuit subarray most adjacent to the peripheral region is configured to be removed along the direction parallel to the base substrate.

In some embodiments, the plurality of dummy circuit subarrays in the direction parallel to the base substrate comprises a first dummy circuit subarray adjacent to the peripheral region and a second dummy circuit subarray far away from the peripheral region, the first dummy circuit subarray and the second dummy circuit subarray both comprise dummy circuits; the circuit vacant region comprises a first sub-vacant region and a second sub-vacant region; all the dummy circuits in the first dummy circuit subarray are configured to be removed to form the first sub-vacant region; at least part of the dummy circuits in the second dummy circuit subarray is configured to be removed to form the second sub-vacant region; the second sub-vacant region is farther away from the peripheral region than the first sub-vacant region along the direction parallel to the base substrate.

In some embodiments, wherein a total number of dummy circuits being removed in the second dummy circuit subarray is less than a total number of dummy circuits being removed in the first dummy circuit subarray.

In some embodiments, the drive circuit array comprises a plurality of drive circuit subarrays provided along the direction parallel to the base substrate, the plurality of drive circuit subarrays comprising a first drive circuit subarray provided between the first dummy circuit subarray and the second dummy circuit subarray in the direction parallel to the base substrate; the first drive circuit subarray is configured to be moved along the direction parallel to the base substrate and adjacent to the second dummy circuit subarray, so that at least part of the first drive circuit subarray replaces the at least part of the dummy circuit being removed in the second dummy circuit subarray to form the second sub-vacant region.

In some embodiments, the dummy circuit subarray most adjacent to the peripheral region comprises at least two lines of dummy circuits provided along the direction parallel to the base substrate, and the at least two lines of dummy circuits comprising a first line of dummy circuits adjacent to the peripheral region and a second line of dummy circuits far away from the peripheral region; all the first line of dummy circuits is configured to be removed, and all the second line of dummy circuits is configured to be retained.

In some embodiments, the display region comprises a first side and a second side provided opposite to each other in the first direction, the first direction parallels to the base substrate; the peripheral circuit comprises a first peripheral subcircuit provided on the first side and a second peripheral subcircuit provided on the second side; the plurality of dummy circuit subarrays comprising a third dummy circuit subarray most adjacent to the first peripheral subcircuit in the first direction and a fourth dummy circuit subarray most adjacent to the second peripheral subcircuit; at least part of the third dummy circuit array is configured to be removed such that a first circuit vacant region is formed on a side of the driving structure layer adjacent to the first peripheral subcircuit, and the first circuit vacant region is configured to accommodate at least part of the first peripheral subcircuit; at least part of the fourth dummy circuit array is configured to be removed, such that a second circuit vacant region is formed on a side of the driving structure adjacent to the second peripheral subcircuit, and the second circuit vacant region is configured to accommodate at least part of the second peripheral subcircuit.

In some embodiments, the first peripheral subcircuit comprises a first gate drive circuit, the first gate drive circuit is provided in the first circuit vacant region; the second peripheral subcircuit comprises a second gate drive circuit, the second gate drive circuit is provided in the second circuit vacant region; the first gate drive circuit and the second gate drive circuit are configured to provide a gate scanning signal to the drive circuit array.

In some embodiments, the drive circuit array comprises a plurality of drive circuit subarrays provided in the direction parallel to the base substrate, and at least one drive circuit subarray in the plurality of drive circuit subarray is provided between two adjacent dummy circuit subarrays in the plurality of dummy circuit subarrays.

In some embodiments, an orthographic projection of the at least part of the peripheral circuit on the base substrate is within the display region and overlaps with an orthographic projection of the light-emitting structure layer on the base substrate.

In some embodiments, the drive structure layer comprises a plurality of lines of sub-drive structures provided in a second direction, each line of the sub-drive structure comprises a drive circuit and a dummy circuit provided in the first direction, wherein the drive circuit is part of the drive circuit array, the dummy circuit is part of the dummy circuit array, the first direction and the second direction are parallel to the base substrate and perpendicular to each other; the peripheral region comprises a chip region provided on one side of the display region and a signal connection region provided between the display region and the chip region in the second direction; the peripheral circuit further comprises a signal connection line provided in the signal connection region, the signal connection line is configured to be connected with a signal line in the display region, the signal line is connected to at least one of the light-emitting structure array and the drive circuit array; wherein at least part lines of sub-drive structures in the plurality of sub-drive structures are provided with unequal spacing in the second direction, such that a signal-line vacant region is formed on a side of the drive circuit layer adjacent to the signal connection region, and the signal-line vacant region is configured to accommodate at least part of the signal connection line.

In some embodiments, in at least part lines of sub-drive structures, every two adjacent lines of sub-drive structures have a spacing in the second direction, and a plurality of the spacing gradually decrease in the direction adjacent to the signal connection region.

In some embodiments, in the at least part lines of sub-drive structures, a maximum spacing is provided between two lines of sub-drive structures farthest from the signal connection region in the second direction, and a minimum spacing is provided between two lines of sub-drive structures most adjacent to the signal connection region in the second direction; the plurality of spacing is reduced from the maximum spacing to the minimum spacing with an equal or unequal difference gradient.

In some embodiments, an orthographic projection of the at least part of the signal connection line on the base substrate is within the display region and overlaps with an orthographic projection of the light-emitting structure layer on the base substrate.

In some embodiments, the light-emitting structure array comprises a plurality of light-emitting structures provided in a direction parallel to the base substrate; the drive circuit array comprises a plurality of drive circuits provided in the direction parallel to the base substrate; the plurality of light-emitting structures and the plurality of drive circuits are one-to-one connected with each other, and in the direction parallel to the base substrate, a width of each light-emitting structure is greater than a width of each of the drive circuits.

In some embodiments, the light-emitting structure layer comprises m×n light-emitting structures, the driving structure layer comprises m×n drive circuits and m×A dummy circuits, wherein m is an integer greater than or equal to 1, A is an integer greater than or equal to 1, and n is greater than or equal to 2 and less than or equal to 8.

In some embodiments, the drive circuit has a width x, the dummy circuit R has a width r, the light-emitting structure E has a width e, and a relationship between them is as follows: e×n=x×n+r×A.

According to second aspect of the present disclosure, it is provided a display device, comprising the above-mentioned display substrate.

According to third aspect of the present disclosure, it is provided a manufacturing method of a display substrate, the display substrate comprises a display region and a peripheral region provided on at least one side of the display region, the manufacturing method comprising: providing a base substrate; sequentially forming a driving structure layer and a light-emitting structure layer in the display region of the base substrate, wherein the light-emitting structure layer comprises a light-emitting structure array, and the driving structure layer comprises a drive circuit array and a dummy circuit array; forming a peripheral circuit in the peripheral region of the base substrate, and the peripheral circuit is connected to at least one of the light-emitting structure array and the drive circuit array; removing at least part of the dummy circuit array from the drive structure layer, such that a circuit vacant region is formed on a side of the drive structure layer adjacent to the peripheral region, and the circuit vacant region is configured to accommodate at least part of the peripheral circuit.

BRIEF DESCRIPTION OF DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
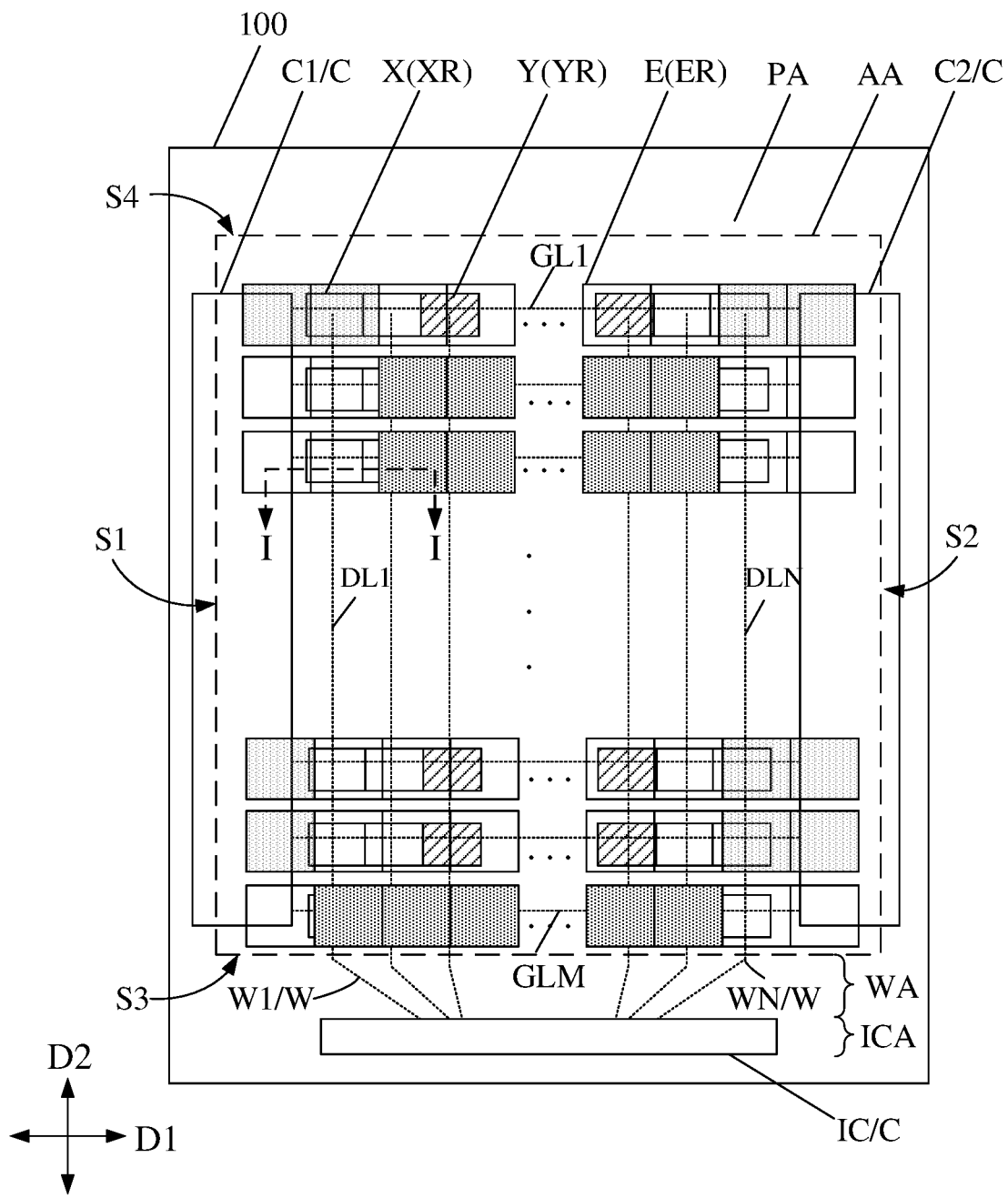
FIG. 1 is a schematic structure diagram of a display substrate provided in an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. The terms "includes," "including." "includes." "including." etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right." "left" and the like are only used to indicate relative position relationship, and when the position of the object which is described is changed, the relative position relationship may be changed accordingly.

OLED uses a current-driven method to achieve lighting emission, and in order to achieve accurate control of pixel brightness, it is usually necessary to design a pixel drive circuit to drive the pixel. Moreover, in order to achieve data writing line-by-line for each pixel, a gate drive circuit needs to provide a gate scan signal, and a signal line, such as a data line, needs to provide a data signal to the pixel drive circuit. However, both the gate drive circuit and the signal line occupy the frame space of the display, resulting in a wide frame of the display and the ideal narrow frame design cannot be realized.

According to embodiments of the present disclosure, a display substrate and a manufacturing method thereof and a display device are provided to reduce space occupied by the peripheral circuit at the frame, so as to achieve a narrow frame design.

The embodiment of the present disclosure provides a display substrate, including a display region and a peripheral region located on at least one side of the display region, the display substrate includes a base substrate, a drive structure layer and a light-emitting structure layer sequentially stacked on the base substrate and provided in the display region, and a peripheral circuit. The light-emitting structure layer includes a light-emitting structure array, and the driving structure layer includes a drive circuit array and a dummy circuit array. The peripheral circuit is on the base substrate and is provided in the peripheral region, and the peripheral circuit is connected to at least one of the light-emitting structure array and the drive circuit array. At least part of the dummy circuit array is configured to be removed from the drive structure layer, such that a circuit vacant region is provided on a side of the drive structure layer adjacent to the peripheral region, and the circuit vacant region is configured to accommodate at least part of the peripheral circuit.

In the display substrate of the above embodiment, by removing at least part of the dummy circuit array in the drive structure layer located in the display region, a circuit vacant region is provided on the side of the drive structure layer adjacent to the peripheral region, thereby providing a space to accommodate part of the peripheral circuit, so that the part of the peripheral circuit originally located in the peripheral region is provided in the display region, thereby reducing the space occupied by the peripheral circuit at the frame of the display substrate, and thus realizing a narrow frame design.

In the embodiment of the present disclosure, the formation of a circuit vacant region includes two ways: the first way is to form a circuit vacant region by removing a part of the dummy circuit array adjacent to the peripheral region; and the second way is to form a circuit vacant region by removing a part of the dummy circuit array far away from the peripheral region and moving the drive circuit array so that the drive circuit array occupies the position where the removed part of the dummy circuit array was located, thereby forming the circuit vacant region at the edge of the display region. These two ways may be used in different embodiments, respectively, or combined in one embodiment, the embodiment of the present disclosure is not limited to this.

Hereinafter, the present disclosure will be explained by several specific embodiments. In order to keep the following description of the embodiments of the present disclosure clear and concise, detailed descriptions of known functions and known components may be omitted. In the case that any component of an embodiment of the present disclosure appears in more than one figure, the component may be denoted by the same reference numeral in each of the figures.

Figure 2:
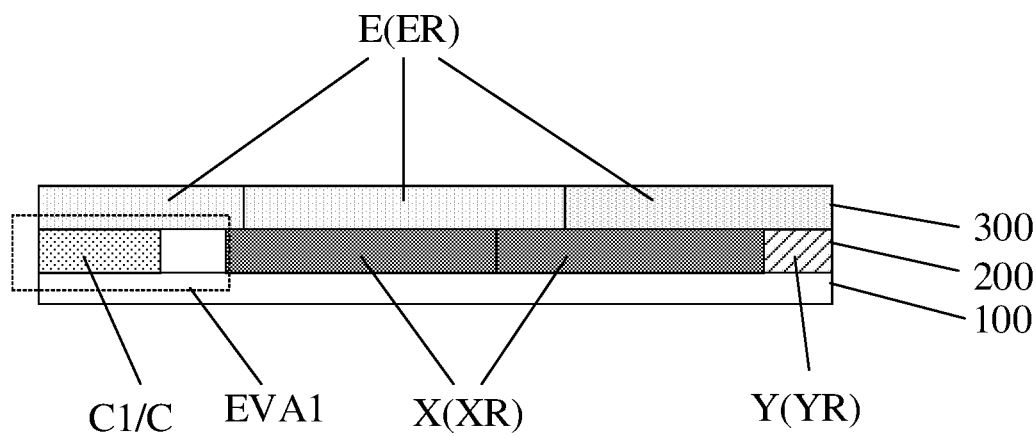
FIG. 2 is a schematic cross-sectional view taken along I-I line of FIG. 1.

FIG. 1 is a schematic structure diagram of a display substrate provided in an embodiment of the present disclosure. FIG. 2 is a schematic cross-sectional view taken along I-I line of FIG. 1.

For example, as shown in FIG. 1, the display substrate includes a base substrate 100, the base substrate 100 includes a display region (i.e., a pixel array region) AA and a peripheral region PA located on at least one side of the display region AA. For example, the peripheral region PA surrounds the display region AA. As shown in FIGS. 1 and 2, for example, the display region AA includes a base substrate 100, and a drive structure layer 200 and light-emitting structure layer 300 sequentially stacked on the base substrate 100 and provided in the display region AA. That is, the light-emitting structure layer 300 is located on a side of the drive structural layer 200 facing away from the base substrate 100. In the display region AA, the drive structure layer 200 and the light-emitting structure layer 300 overlap each other in a direction of perpendicular to the base substrate 100, which can save the space occupied by the driving structure layer 200 and the light-emitting structure layer 300 in the display region.

For example, as shown in FIGS. 1 and 2, the drive structure layer 200 includes a drive circuit array XR and a dummy circuit array YR. That is, the drive circuit array XR and the dummy circuit array YR are located in the drive structure layer 200. The drive circuit array XR includes a plurality of drive circuits X arranged in a direction parallel to the plane where the base substrate 100 is located. Dummy circuit array YR includes a plurality of dummy circuits Y arranged in a direction parallel to the plane where the base substrate 100 is located. By arranging the dummy circuit array YR in the display region AA, the uniformity of all drive circuits X in the display region AA can be fully guaranteed when driving the display. For example, in a row direction, one or more dummy circuits Y are provided every certain number of drive circuits X. In this way, by arranging one or more dummy circuits Y in each row of drive circuit X, the uniformity of the drive circuits in each row can be guaranteed when driving the display. In the embodiments of the present disclosure, "a plurality of" means two or more than two.

For example, as shown in FIGS. 1 and 2, the light-emitting structure layer 300 includes a light-emitting structure array ER, and the light-emitting structure array ER includes a plurality of light-emitting structures E arranged in a direction parallel to the plane where the base substrate 100 is located. For example, the light-emitting structure includes an organic light-emitting diode, and the organic light-emitting diode includes a first electrode, an organic functional layer, and a second electrode stacked sequentially. The organic functional layer includes, for example, a light-emitting layer. Further, as needed, the organic functional layer further includes, for example, a hole injection layer, a hole transport layer, an electron injection layer, an electron transport layer, and the like. The first electrode and the second electrode each includes conductive materials. When a voltage is applied between the first electrode and the second electrode, the light-emitting layer can emit light under the action of an electric field, such as red, green, blue, white, yellow, etc. The specific structure and materials of the light-emitting structure may refer to the conventional design, and the embodiment of the present disclosure is not described in detail.

In the embodiment of the present disclosure, a plurality of drive circuits X are one-to-one connected with a plurality of light-emitting structures E, thereby controlling the brightness of the light-emitting structure E. The dummy circuit Y is not connected to the light-emitting structure E, thus avoiding interference with the brightness of the light-emitting structure E. For example, the dummy circuit Y has the same structure as the drive circuit X. Each drive circuit X and its corresponding light-emitting structure E constitute a pixel unit in the display region AA, for example, each pixel unit includes a conventional circuit structure having 2T1C, 4T1C or 7T1C, etc. in the art, the embodiment of the present disclosure does not limit the specific circuit structure of the pixel unit.

For example, the display substrate further includes a peripheral circuit C, the peripheral circuit C is located on the base substrate 100 and is located in the peripheral region PA. The display region AA includes a first side S1 and a second side S2 (e.g., left and right sides as shown in the figures) provided opposite to each other in a direction parallel to the plane where the base substrate 100 is located (e.g., the first direction D1 as shown in the figure). The peripheral circuit C includes a first peripheral subcircuit C1 located on the first side S1 and a second peripheral subcircuit C2 located on the second side S2.

Figure 3:
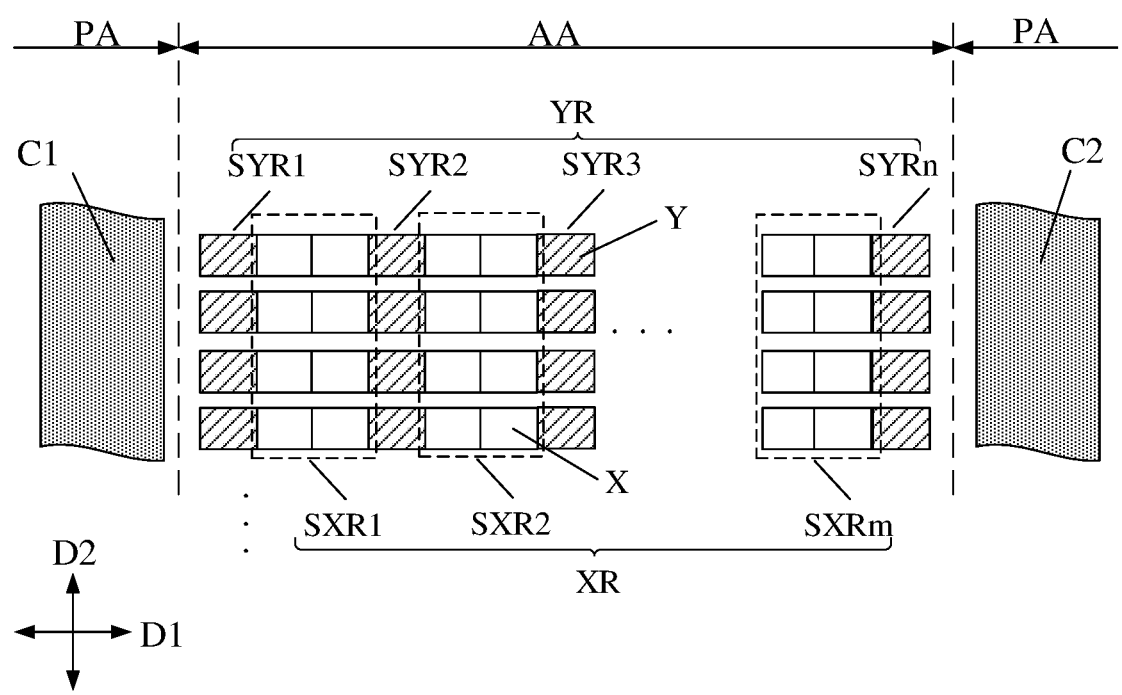
FIG. 3 is a schematic partial structure diagram of a drive circuit array and a dummy circuit array on a display substrate before removing part of the dummy circuit array provided by an embodiment of the present disclosure.
Figure 4:
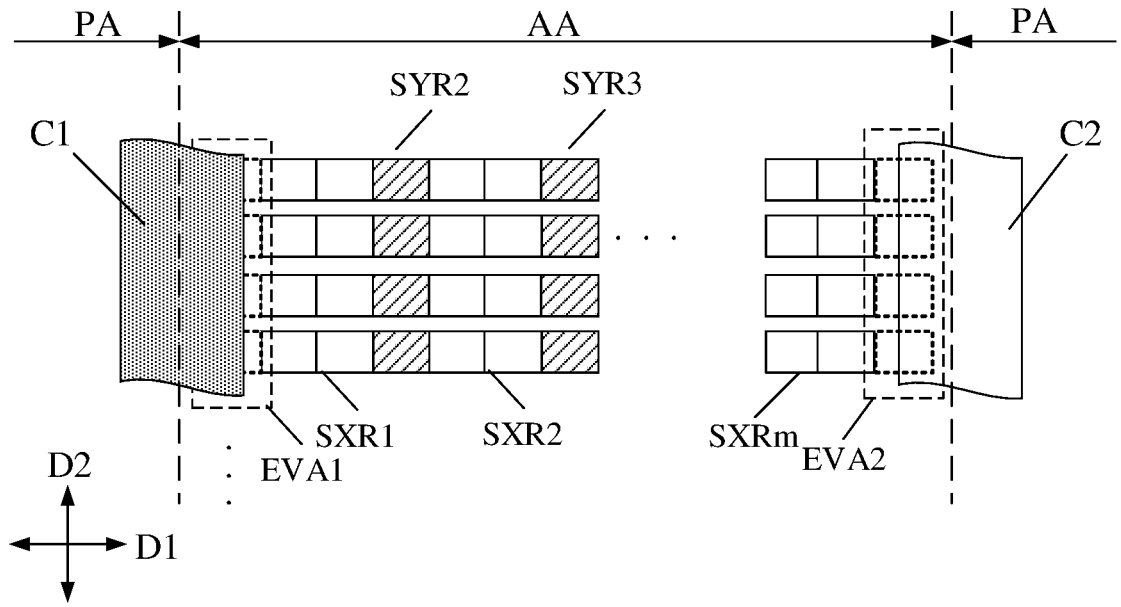
FIG. 4 is a schematic partial structure diagram of a drive circuit array and a dummy circuit array on a display substrate after removing part of the dummy circuit array provided by an embodiment of the present disclosure.

FIG. 3 is a schematic partial structure diagram of a drive circuit array and a dummy circuit array on a display substrate before removing part of the dummy circuit array provided by an embodiment of the present disclosure. FIG. 4 is a schematic partial structure diagram of a drive circuit array and a dummy circuit array on a display substrate after removing part of the dummy circuit array provided by an embodiment of the present disclosure. For example, FIG. 3 is a partially schematic diagram of the display substrate shown in FIG. 1 before removing part of the dummy circuit array, and FIG. 4 is a partially schematic diagram of the display substrate in FIG. 1.

As shown in FIG. 3, the drive circuit array XR includes a plurality of drive circuit subarrays SXR1, SXR2 . . . SXRm arranged along the first direction D1, where m is an integer greater than or equal to 1. The dummy circuit array YR includes a plurality of dummy circuit subarrays SYR1, SYR2 . . . SYRn arranged in the first direction D1, where n is an integer greater than or equal to 1. The plurality of drive circuit subarray SXR and the plurality of dummy circuit subarray SYR are located in the drive structure layer 200 of the display region AA.

As shown in FIG. 3, the dummy circuit subarray SYR1 is located between the peripheral region PA and the drive circuit subarray SXR1 along the first direction D1, and the dummy circuit subarray SYRn is located between the peripheral region PA and the drive circuit subarray SXRm along the first direction D1. Before removing the dummy circuit subarray SYR1 and SYRn, the first peripheral subcircuit C1 and the second peripheral subcircuit C2 are located in the peripheral region PA, resulting in a wider width of the frame of the display substrate on the first direction D1.

In the embodiment of the present disclosure, the dummy circuit subarray SYR1, SYRn in FIG. 3 is configured to be removed to obtain the display substrate of FIG. 4.

As shown in FIG. 4, when the dummy circuit subarrays SYR1, SYRn are removed, due to the positions or spaces occupied by the dummy circuit subarrays SYR1, SYRn are released or vacant, a first circuit vacant region EVA1 and a second circuit vacant region EVA2 are formed in the drive structure layer 200. The first circuit vacant region EVA1 and the second circuit vacant region EVA2 are located on the side of the drive structure layer 200 adjacent to the peripheral region PA, so that at least part of the first peripheral subcircuit C1 and at least part of the second peripheral subcircuit C2 can be accommodated, respectively. Thus, by forming the first circuit vacant region EVA1 and the second circuit vacant region EVA2 in the drive circuit layer 200, the first peripheral subcircuit C1 and the second peripheral subcircuit C2 are provided with a space to shrink towards the display region AA, and at least part of the first peripheral subcircuit C1 and at least part of the second peripheral subcircuit C2 originally located in the peripheral region PA are provided into the display region AA, reducing the frame width of the display substrate.

Referring to FIG. 2 again, at least part of the first peripheral subcircuit C1 is moved to be under the light-emitting structure layer 300. Thus, in a direction perpendicular to the plane where the base substrate 100 is located, at least part of the first peripheral subcircuit C1 overlaps with the light-emitting structure layer 300, and further, the at least part of the first peripheral subcircuit C1 overlaps with the light-emitting structure array ER. In this way, the frame width of the display substrate can be reduced without changing the existing layout design of the light-emitting structure array ER and without affecting the normal light emission of the display.

In the embodiment of the present disclosure, the circuit structures in the first peripheral subcircuit C1 and the second peripheral subcircuit C2 may be the same or different from each other. When the two are the same, it can simplify the circuit design and reduce the manufacturing difficulty, so it is preferred. The first peripheral subcircuit C1 is used as an example to be illustrated below.

Figure 5:
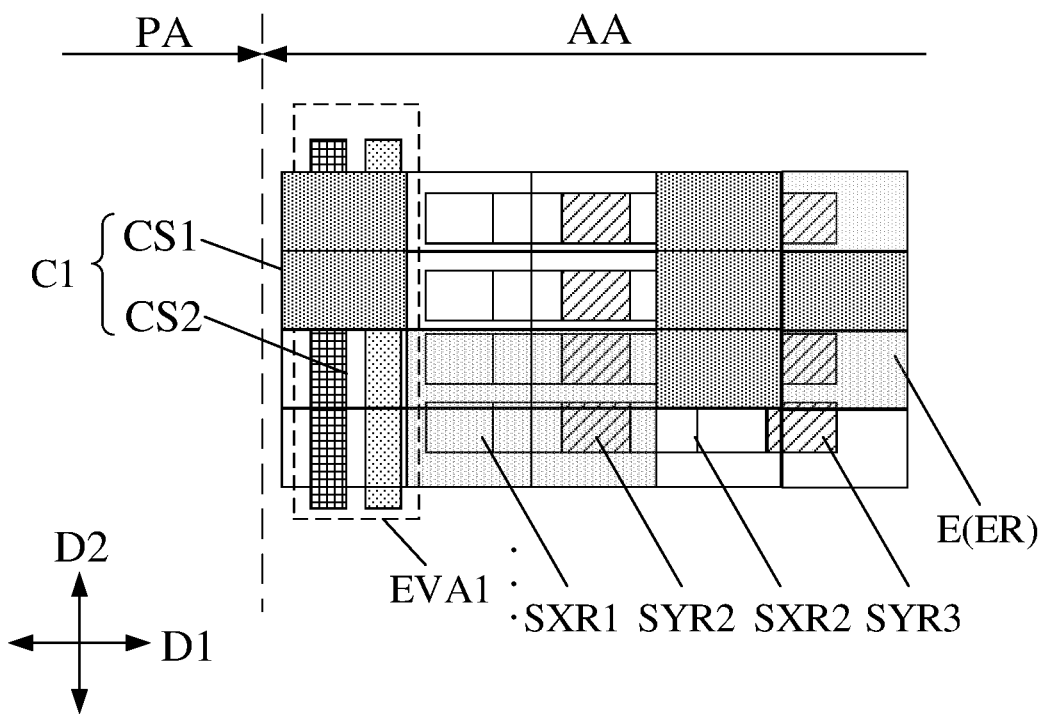
FIG. 5 is a schematic partial structure diagram of a display substrate provided by another embodiment of the present disclosure.

FIG. 5 is a schematic partial structure diagram of a display substrate provided by another embodiment of the present disclosure. The difference between FIG. 5 and FIG. 4 is that only part of the first peripheral subcircuit C1 in FIG. 4 is located in the first circuit vacant region EVA1, while all the first peripheral subcircuit C1 in FIG. 5 is located in the first circuit vacant region EVA1. For illustration purposes, FIG. 5 shows only the peripheral region located on the first side S1 of the display region AA.

As shown in FIG. 5, for example, the first peripheral subcircuit C1 includes a gate drive circuit CS1, and the gate drive circuit CS1 includes, for example, a plurality of cascaded shift register units (not shown). The shift register unit is used to provide a gate scanning signal to the drive circuit array XR in the display region AA to control each row of drive circuits to turn on sequentially. For example, the first peripheral subcircuit C1 further includes a light-emitting drive circuit CS2, for example, the light-emitting drive circuit CS2 includes a plurality of cascaded light-emitting control units (not shown). The light-emitting control unit is used to provide the light-emitting control signal to the light-emitting structure array ER in the display region AA. For example, a gate line connected to the shift register unit (not shown in FIG. 5) is connected to each row of drive circuit X to provide the gate scanning signal. A light-emitting control line connected to the light-emitting control unit (not shown in FIG. 5) is connected to each row of light-emitting structure E to provide a light-emitting control signal.

As shown in FIG. 5, the gate drive circuit CS1 and the light-emitting drive circuit CS2 are located in the first circuit vacant region EVA1, so that all the first peripheral subcircuit C1 is located in the first circuit vacant region EVA1; compared with the frame shown in FIG. 4, FIG. 5 can save more space occupied by the first peripheral subcircuit C1 in the peripheral region, so that the frame width is the narrowest.

It can be contemplated that, only one of the gate drive circuit CS1 and the light-emitting drive circuit CS2 in FIG. 5 may be located in the first circuit vacant region EVA1. For example, the gate drive circuit CS1 that is more adjacent to the drive circuit array XR in the first direction D1 is located in the first circuit vacant region EVA1, which can also reduce the width of the frame to some extent.

In FIG. 1, FIG. 4, and FIG. 5, each drive circuit subarray SXR includes two columns (the term "columns" or "rows" used in the present application may be named as "lines") of drive circuit X, and each dummy circuit subarray SYR includes one column of dummy circuit Y. However, in other embodiments, each drive circuit subarray SXR may include one or more columns of drive circuit X, each dummy circuit subarray SYR may likewise include one or more columns of dummy circuit Y, the embodiment of the present disclosure is not limited to this. Moreover, the total number of drive circuits in the plurality of drive circuit subarrays may be the same or different from one another, and the total number of dummy circuits in the plurality of dummy circuit subarrays may be the same or different from one another, and the embodiment of the present disclosure does not limit this.

FIG. 1, FIG. 4 and FIG. 5, the removed part of the dummy circuit arrays YR are all dummy circuits of the two dummy circuit subarrays SYR1, SYRn, however, in other embodiments, in the case that the dummy circuit subarray SYR1, SYRn includes a plurality of columns of dummy circuits, the removed part may be at least one column of the plurality of columns of dummy circuits, and the other columns of dummy circuits in the plurality of columns of dummy circuits can still be retained, which can also achieve the purpose of reducing the frame width.

In FIG. 1, FIG. 4, and FIG. 5, the dummy circuit subarray SYR1 which is most adjacent to the peripheral PA is configured to be removed. In this way, by preferentially removing the dummy circuit subarrays most adjacent to the peripheral region PA, the affect on the existing layout of the drive circuit array XR and the dummy circuit array YR in the drive structure layer 200 can be avoided.

In the above embodiments of the present disclosure, the first circuit vacant region EVA1 and the second circuit vacant region EVA2 are formed by removing at least part of the dummy circuit array adjacent to the first peripheral subcircuit C1 and the second peripheral subcircuit C2 at the edge of the display region AA, so that without changing the existing layout of the drive circuit array and the dummy circuit array located in the middle region of the display region, a narrow frame can be achieved.

Figure 6:
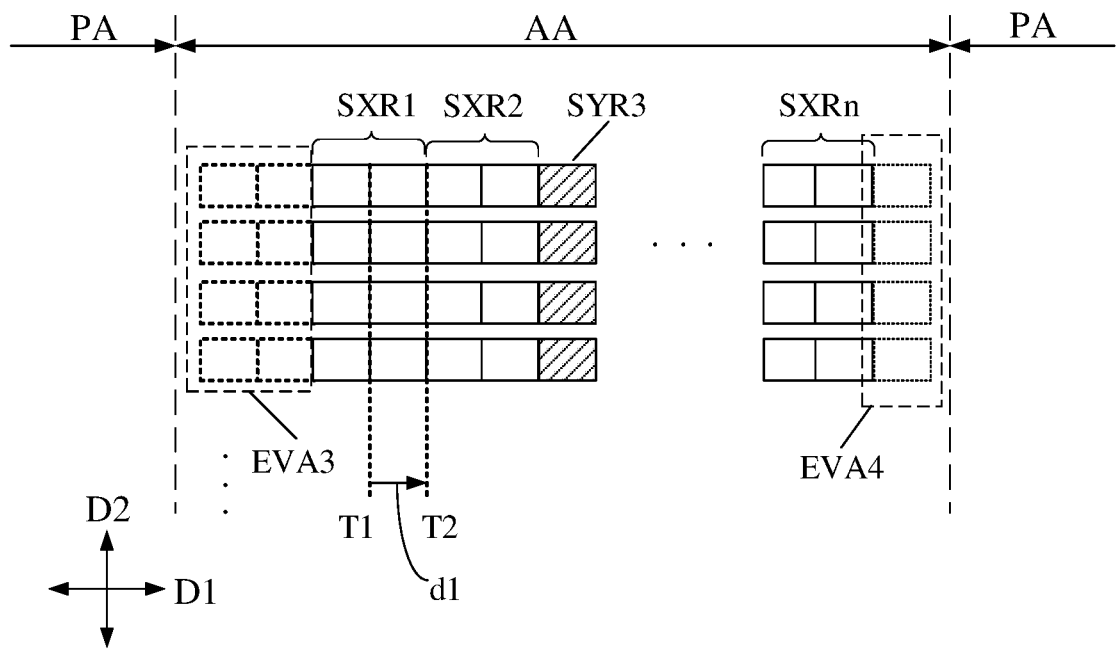
FIG. 6 is a schematic partial structure diagram of a drive circuit array and a dummy circuit array in a display substrate provided by yet another embodiment of the present disclosure.
Figure 7:
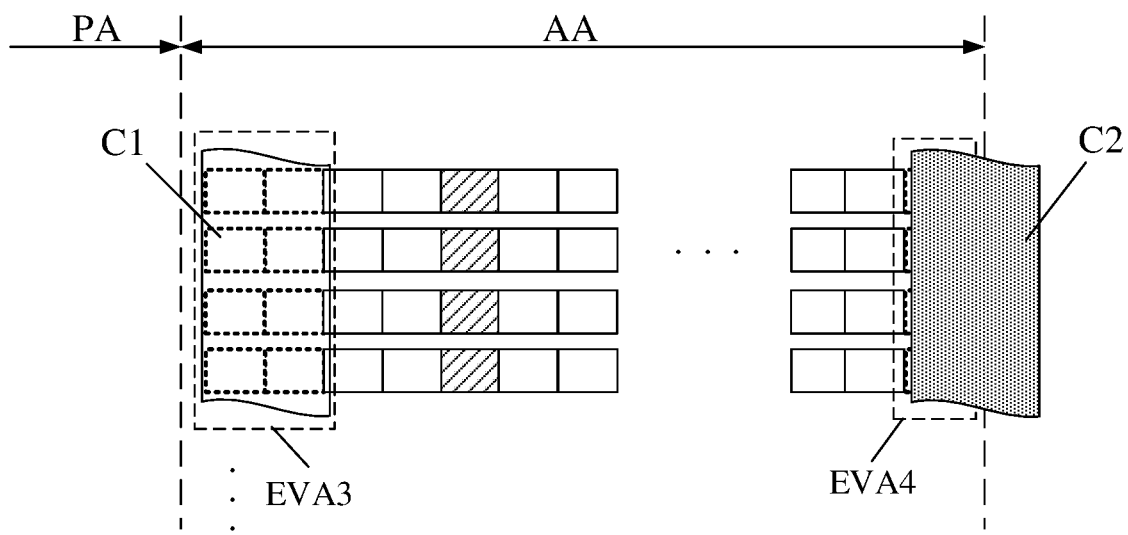
FIG. 7 is a schematic partial structure diagram of a peripheral circuit, a drive circuit array, and a dummy circuit array in the display substrate of FIG. 6.

FIG. 6 is a schematic partial structure diagram of a drive circuit array and a dummy circuit array in a display substrate provided by yet another embodiment of the present disclosure. FIG. 7 is a schematic partial structure diagram of a peripheral circuit, a drive circuit array, and a dummy circuit array in the display substrate of FIG. 6. For example, FIGS. 6 and 7 illustrate the drive circuit array and dummy circuit array of the display substrate of FIG. 3 in another manner different from FIG. 4 after removing part of the dummy circuit array.

In the embodiment of the present disclosure, three dummy circuit subarrays SYR1, SYR2, SYRn of FIG. 3 are configured to be removed, thereby obtaining the display substrate shown in FIGS. 6 and FIG. 7.

As shown in FIGS. 6 and 7, in the case that the dummy circuit subarrays SYR1 and SYR2 in FIG. 3 are removed, the positions or space occupied by the dummy circuit subarrays SYR1 and SYR2 are released or vacant. Because the drive circuit subarray SXR1 in FIG. 3 is located between the first peripheral subcircuit C1 and the dummy circuit subarray SYR2 along the first direction D1, the drive circuit subarray SXR1 may be moved towards to the dummy circuit subarray SYR3 by a certain distance d1 in the first direction D1, for example, the distance d1 is substantially equal to the width of the dummy circuit subarray SYR2 (i.e., the lateral width along the first direction D1), so that the drive circuit subarray SXR1 is moved from position T1 to position T2 in FIG. 6, thereby replacing the removed dummy circuit subarray SYR2 in the position originally occupied by the dummy circuit subarray SYR2, and thus forming a third circuit vacant region EVA3 on the side of the drive structure layer 200 adjacent to the peripheral region PA. Because the third circuit vacant region EVA3 is formed by together removing the dummy circuit subarray SYR1 and SYR2, the area of the third circuit vacant region EVA3 is larger than the area of the first circuit vacant region EVA1, which can provide larger accommodation space for the peripheral circuit.

As shown in FIGS. 6 and 7, in the case that the dummy circuit subarray SYRn in FIG. 3 is removed, the fourth circuit vacant region EVA4 is formed.

As shown in FIG. 7, after forming the third circuit vacant region EVA3 and the fourth circuit vacant region EVA4, the first peripheral subcircuit C1 is provided in the third circuit vacant region EVA3, and the second peripheral subcircuit C2 is provided in the fourth circuit vacant region EVA3, thereby greatly reducing the frame width of the display substrate.

In the embodiments of the present disclosure, the areas of overlapping regions of the first peripheral subcircuit C1 and the second peripheral subcircuit C2 respectively overlapping with the display region AA may be the same or different from each other. For example, as shown in FIG. 7, the area of the overlapping region of the first peripheral subcircuit C1 overlapping with the display region AA is greater than the area of the overlapping region of the second peripheral subcircuit C2 overlapping with the display region AA.

In the embodiment of the present disclosure, in the case that the area of the overlapping region of the first peripheral subcircuit C1 and the display region AA, and the area of the overlapping region of the second peripheral subcircuit C2 and the display region AA are the same, the frame of the display substrate may be designed symmetrically, which can simplify the design difficulty. In the case that the areas of the two overlapping regions are different from each other, the width of the single-sided frame of the display region can be flexibly adjusted to meet the requirements of different application environments. In the actual product, the position relationship between the first peripheral subcircuit C1 and the second peripheral subcircuit C2 may be determined according to actual needs, and the embodiment of the present embodiment is not limited to this.

As shown in FIG. 7, the orthographic projection of the first peripheral subcircuit C1 on the plane where the base substrate 100 is located and the orthographic projection of the third circuit vacated region EVA3 on the plane where the base substrate 100 is located overlaps with each other. The orthographic projection of the second peripheral subcircuit C2 on the plane where the base substrate 100 is located overlaps with the orthographic projection of the fourth circuit vacant region EVA4 on the plane where the base substrate 100 is located.

FIG. 6 and FIG. 7 only show the case of removing the dummy circuit subarray SYR1, SYR2 on one side adjacent to the peripheral region PA, and thus forming the third circuit vacant region EVA3. It should be understood that, in other embodiments, more dummy circuit subarrays may be removed according to actual requirements, such as removing SYR1, SYR2, SYR3, so that the area of the formed third circuit vacant region EVA3 is larger, thereby accommodating more peripheral circuits.

FIG. 6 and FIG. 7 only show the case that the dummy circuit subarray SYR2 includes one column of dummy circuit Y. It should be understood that, in other embodiments, the dummy circuit subarray SYR2 may include a plurality of columns of dummy circuit. In this case, one, two, or more columns in the plurality of columns of dummy circuit can be removed, and the third circuit vacant region EVA3 is also be formed on the side of the driving structure layer 200 adjacent to the peripheral region PA, and thus realizing a narrow frame design.

It should be noted that the position of the light-emitting structure layer and the layout of the light-emitting structure array in FIGS. 6 and 7 may be referred to those in FIGS. 1 and 2. Because FIGS. 6 and 7 change the layout of the drive circuit array, dummy circuit array, and peripheral circuits in the drive structure layer, the light-emitting structure layer is omitted.

Figure 8:
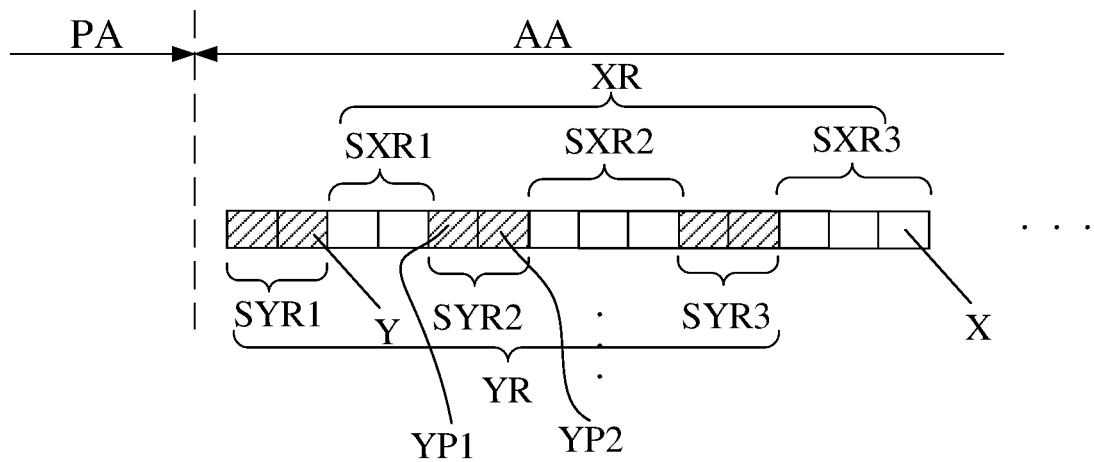
FIG. 8 is a schematic partial structure diagram of a drive circuit array and a dummy circuit array on a display substrate before removing part of the dummy circuit array provided by still another embodiment of the present disclosure.
Figure 9A:
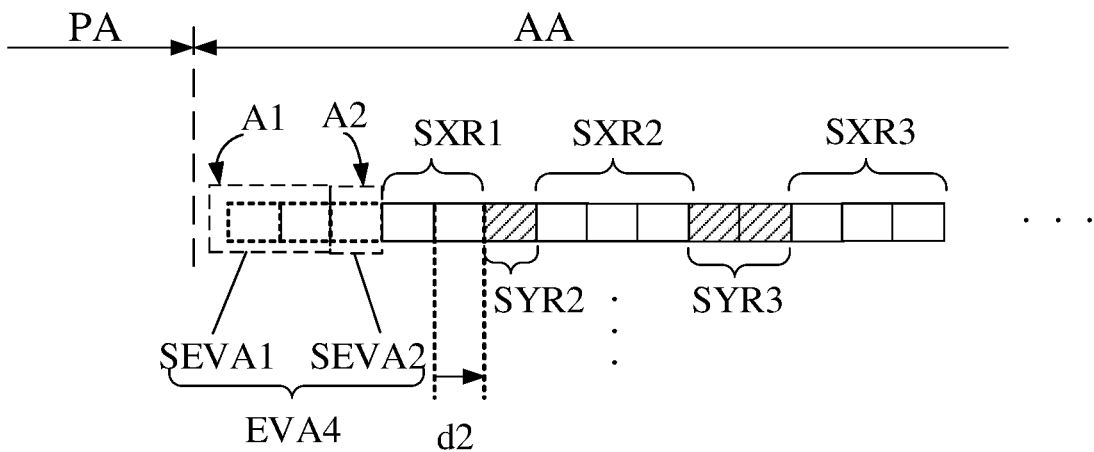
FIGS. 9(a) and 9(b) are schematic partial structure diagrams of the drive circuit array and the dummy circuit array on the display substrate of FIG. 8 after removing part of the dummy circuit array.
Figure 9B:
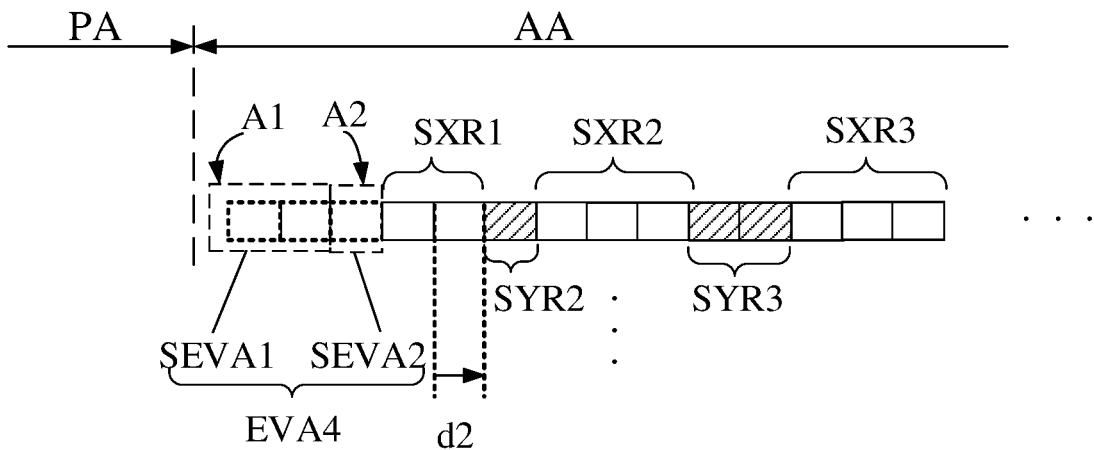

FIG. 8 is a schematic partial structure diagram of a drive circuit array and a dummy circuit array on a display substrate before removing part of the dummy circuit array provided by yet another embodiment of the present disclosure. FIGS. 9(a) and 9(b) are schematic partial structure diagrams of the drive circuit array and the dummy circuit array on the display substrate of FIG. 8 after removing part of the dummy circuit array.

FIG. 8, FIG. 9(a) and FIG. 9(b) illustrate another layout of the drive circuit array and the dummy circuit array that may also be applied to the display substrate of FIG. 1. For clear illustration, FIG. 8, FIG. 9(a) and FIG. 9(b) only show a schematic diagram of the partial structure of the drive circuit array and the dummy circuit array located on the first side S1 adjacent to the display region of the display region AA of FIG. 1, and only one row of pixel unit is taken as an example. It can be understood that other rows of pixel unit can also be arranged or provided in this way.

As shown in FIG. 8, the dummy circuit array YR includes a plurality of dummy circuit subarrays, and the plurality of dummy circuit subarrays include a first dummy circuit subarray SYR1, a second dummy circuit subarray SYR2, and a third dummy circuit subarray SYR3. For example, the first dummy circuit subarray SYR1 is adjacent to the peripheral region PA in the first direction D1, and the second dummy circuit subarray SYR2 is far away from the peripheral region PA in the first direction D1. Each dummy circuit subarray includes a plurality of dummy circuits Y.

As shown in FIG. 8, the drive circuit array XR includes a plurality of drive circuit subarrays, and the plurality of drive circuit subarrays include a first drive circuit subarray SXR1, a second drive circuit subarray SXR2, and a third drive circuit subarray SXR3. For example, the first drive circuit subarray SXR1 is most adjacent to the peripheral region PA in the first direction D1 and is located between the first dummy circuit subarray SYR1 and the second dummy circuit subarray SYR2. Each drive circuit subarray includes a plurality of drive circuits X.

In the present embodiment, all the dummy circuits Y in the first dummy circuit subarray SYR1 of FIG. 8 are configured to be removed, and part of the dummy circuits Y in the second dummy circuit subarray SYR2 is configured to be removed, thereby obtaining the display substrate of FIGS. 9(a) and FIG. 9(b). All the dummy circuits Y in the third dummy circuit subarray SYR3 are retained.

As shown in FIG. 9(a), the total number of dummy circuits Y removed in the second dummy circuit subarray SYR2 is less than the total number of dummy circuits Y removed in the first dummy circuit subarray SYR1. In this way, the frame width of the display substrate can be reduced with the existing layout of the dummy circuit array and the drive circuit array being changed as less as possible.

In another embodiment, in the dummy circuit array, the total number of the removed dummy circuits Y gradually decreases in the direction from the peripheral region PA to the display region AA. In this way, the frame width of the display substrate can also be reduced with the existing layout of the dummy circuit array and the drive circuit array being changed as less as possible.

As shown in FIG. 9(b), after removing the first dummy circuit subarray SYR1, the first sub-vacant region SEVA1 is formed at the first position A1 of the display region AA.

As shown in FIG. 8 and FIG. 9(a), the second dummy circuit subarray SYR2 includes two columns of dummy circuits arranged in the first direction D1, and the two columns of dummy circuits include a first column of dummy circuits YP1 adjacent to the peripheral region PA and a second column of dummy circuits YP2 far away from the peripheral region PA. The first column of dummy circuits YP1 is configured to be removed, and the second column of dummy circuits YP2 is configured to be all retained. In this way, in the case that the dummy circuit subarray SYR includes two or more columns of dummy circuits, by preferentially removing the first column of dummy circuits YP1 more adjacent to the peripheral region PA, the frame width of the display substrate can be reduced with the existing layout of the dummy circuit array being changed as less as possible.

As shown in FIG. 9(b), after removing the first column of dummy circuits YP1, the first drive circuit subarray SXR1 moves towards the second dummy circuit subarray SYR2 in the first direction D1 by a certain distance d2, for example, the distance d2 is substantially equal to the width of one column of dummy circuits Y in the dummy circuit subarray SYR2 (i.e., the lateral width along the first direction D1) to replace the removed first dummy circuit YP1, thus, a second sub-vacant region SEVA2 is formed on the second position A2 of the display region AA, and the second position A2 is farther away from the peripheral region PA than the first position A1.

As shown in FIG. 9(b), because the drive circuit array XR and the dummy circuit array YR are located in the drive structure layer 200, the first sub-vacant region SEVA1 and the second sub-vacant region SEVA2 are also formed on the side of the drive structure layer 200 adjacent to the peripheral region PA, therefore, a fourth circuit vacant region EVA4 is formed on the side of the driving structure layer 200 adjacent to the peripheral region PA. Because the fourth circuit vacant region EVA4 is formed by removing the dummy circuit subarrays SYR1 and SYR2 together, the area of the fourth circuit vacant region EVA4 is larger than the area of the first circuit vacant region EVA1 in FIG. 2, which can provide more space for accommodating the peripheral circuit C. In this way, the first peripheral subcircuit C1 in the peripheral region PA in FIG. 1 can be further moved into the fourth circuit vacant region EVA4 to further reduce the frame width of the display substrate.

In FIG. 8, FIG. 9(a) and FIG. 9(b), the total number of the removed dummy circuit subarrays and the total number of the removed dummy circuits Y are only illustrative, and in other embodiments, the total number of the removed dummy circuit subarray and the total number of the removed dummy circuits Y may be selected according to actual needs. For example, the third dummy circuit subarray SYR3 may be removed, or, all the dummy circuits Y of the second dummy circuit subarray SYR2 may be removed, which can also achieve the purpose of narrow frame.

In FIG. 8, FIG. 9(a), and FIG. 9(b), each dummy circuit subarray is illustrated by including two columns of dummy circuits. However, in other embodiments, each dummy circuit subarray may include one column, three columns, or more than three columns of dummy circuits, and the embodiment of the present disclosure is not limited to this.

In the above embodiment of the present disclosure, at least one drive circuit subarray is provided between two adjacent dummy circuit subarrays. In this way, the uniformity of the drive circuits when driving the display can be guaranteed. For example, before removing part of the dummy circuit array, the plurality of dummy circuit subarrays in the display substrate may be arranged with equal or unequal spacing in the first direction D1. In the case that the plurality of dummy circuit subarrays are arranged with equal spacings, it is more conducive to ensuring the display uniformity, so it is preferred.

The above embodiments of the present disclosure are illustrated by taking the plurality of dummy circuit subarrays arranged along the first direction D1 as an example, in other embodiments, the plurality of dummy circuit subarrays SYR may also be arranged along the second direction D2, in this case, while at least part of the dummy circuit subarrays SYR is configured to be removed, a circuit vacant region may also be formed on the side of the display region AA adjacent to the peripheral region PA (e.g., the third side S3 and/or the fourth side S4 shown in FIG. 1) to accommodate at least part of the peripheral circuit. In this way, the frame width of the display substrate can also be reduced.

Returning to FIG. 1, for example, as shown in FIG. 1, the display region AA further includes a third side S3 and a fourth side S4 provided opposite to each other in the second direction D2 (e.g., the lower and upper sides shown in the figure). The peripheral region PA includes a chip region ICA located on the third side S3 of the display region AA and a signal connection region WA located between the display region AA and the chip region ICA.

For example, the peripheral circuit C further includes a data drive chip IC located in the chip region ICA, and the data drive chip IC is configured to provide data signals to the drive circuits X arranged in an array. The peripheral circuit C further includes a signal connection line W located in the signal connection region WA, the signal connection line W is configured to be connected to the signal line in the display region AA, for example, to be connected to a signal line of at least one of the light-emitting structure array ER and the drive circuit array XR in the display region AA.

As shown in FIG. 1, the data lines DL1-DLN (N is an integer greater than 1) connected to the data drive chip IC extend vertically (for example, the second direction D2 in the figure) in the display region AA to provide data signals for the plurality of columns of the drive circuits X. The gate lines GL1-GLM (M is an integer greater than 1) connected to the first peripheral subcircuit C1 and the second peripheral subcircuit C2 extends transversely (e.g., the first direction D1 in the figure) within the display region AA to provide the gate scan signals for the drive circuits X arranged in the array. The light-emitting control lines (not shown) connected to the first peripheral subcircuit C1 and the second peripheral subcircuit C2 are also extended laterally in the display region AA to provide light-emitting control signals to the drive circuits X arranged in the array.

As shown in FIG. 1, a plurality of signal lines W1-WN are located in the signal connection region WA, and a plurality of signal lines W1-WN are configured to be one-to-one connected with a plurality of data lines DL1-DLN. However, because the plurality of signal connection lines W1-WN in FIG. 1 are located outside the display region AA, the frame on the third side of the display substrate is wider.

Figure 10:
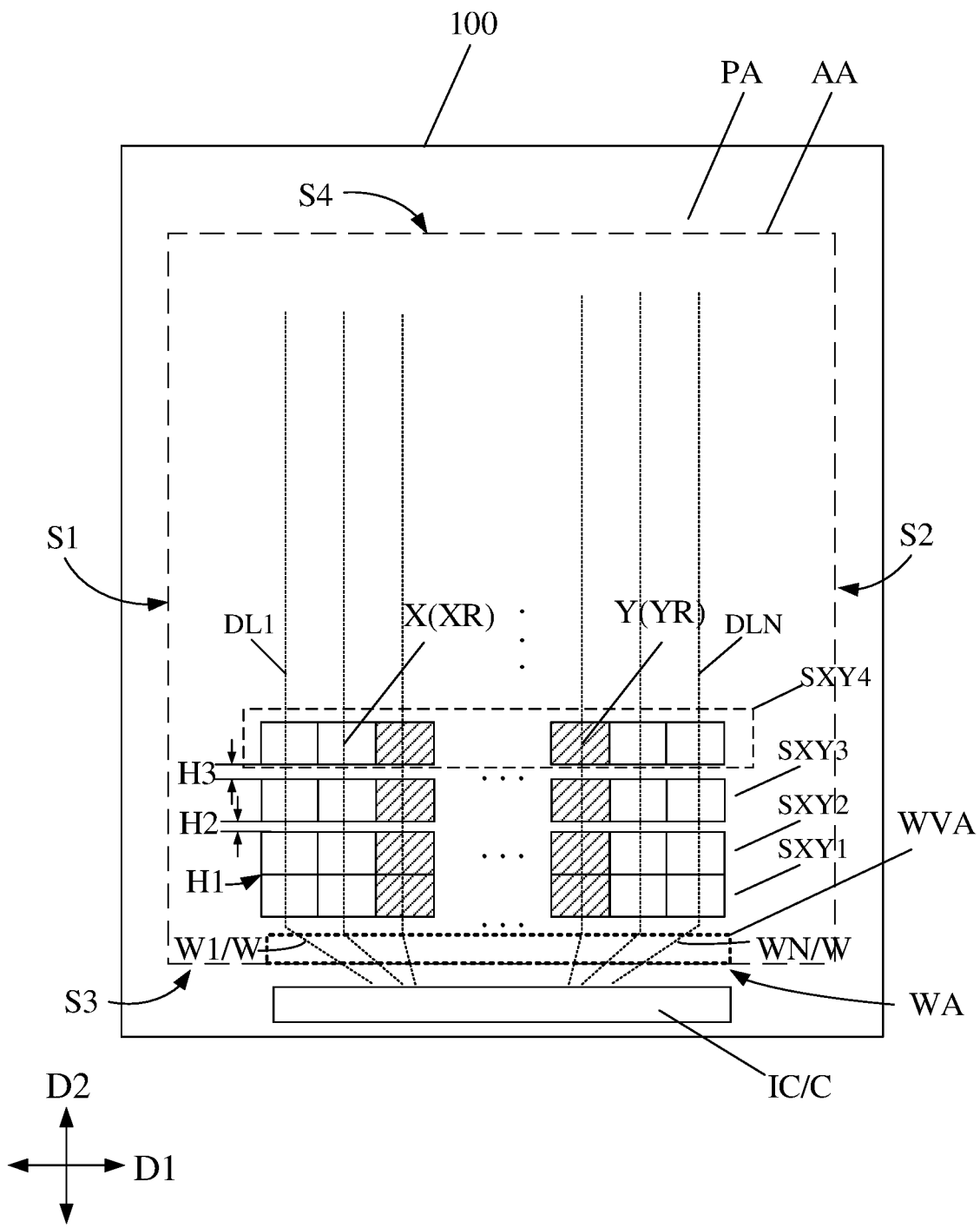
FIG. 10 is a schematic partial structure diagram of a display substrate provided by another embodiment of the present disclosure.

FIG. 10 is a schematic partial structure diagram of a display substrate provided by another embodiment of the present disclosure. For example, FIG. 10 is a schematic diagram of another partial structure of the display substrate of FIG. 1. To simplify the description, FIG. 10 shows only the partial structures of the drive circuit array and the dummy circuit array located in the lower part of the display region of FIG. 1.

As shown in FIG. 10, the drive structure layer 200 includes a plurality of lines (such as a plurality of rows) of sub-drive structures SXY arranged along the second direction D2. Each row of sub-drive structure SXY includes drive circuits X and dummy circuits Y, wherein the drive circuits X are part of the drive circuit array XR, and the dummy circuits Y are part of the dummy circuit array YR.

As shown in FIG. 10, the plurality of rows of sub-drive structures SXY are provided with unequal spacing in the second direction D2, so that a signal-line vacant region WVA is formed on the side of the drive circuit layer 200 adjacent to the signal connection region WA, and the signal-line vacant region WVA is configured to accommodate part of the signal connection lines W. This provides a space for the signal connection line W to shrink into the display region AA and reduces the frame width of the display substrate.

For example, the plurality of rows of sub-drive structures SXY include a first row of sub-drive structures SXY1, a second row of sub-drive structures SXY2, a third row of sub-drive structures SXY3 and a fourth row of sub-drive structures SXY4 arranged sequentially along the second direction D2, wherein the first rows of sub-drive structure SXY1 is most adjacent to the signal connection region WVA.

For example, a first spacing H1 is provided between the first row of sub-drive structures SXY1 and the second row of sub-drive structures SXY2 along the second direction D2, for example, H1=0. A second spacing H2 is provided between the second row of sub-drive structures SXY2 and the third row of sub-drive structures SXY3 along the second direction D2, where H2 is not equal to H1, for example, H2>H1. Further, for example, a third spacing H3 is provided between the third row of sub-drive structures SXY1 and the fourth row of sub-drive structures SXY3 along the second direction D2, wherein H3 is not equal to H2, for example, H3>H2. In one example, H2 is 0.01~0.1 mm, and H3 is 0.1~0.2 mm.

Compared with the plurality of rows of sub-drive structures SXY arranged with equal spacing (for example, the spacing is equal to H3), by allowing the first spacing H1, the second spacing H2 and the third spacing H3 to be not equal to each other, the space occupied by the plurality of rows of sub-drive structures SXY in the display region AA can be reduced, thereby providing the signal connection line W with a space to shrink into the display region AA and reducing the frame width of the display substrate.

In some embodiments, the spacings between other sub-drive structures located above the fourth row of sub-drive structures may be equal to each other, for example, equal to the third spacing H3, so that a narrow frame design can be achieved without affecting the layout of the sub-drive structures located in the middle region of the display region AA.

In the embodiment of the present disclosure, the first spacing H1, the second spacing H2 and the third spacing H3 are gradually reduced in the direction adjacent to the signal connection region WVA, so that the frame width of the display substrate can be reduced with changing the existing layout of a plurality of sub-driver structures as less as possible.

For example, the third spacing H3 is the maximum spacing, the first spacing H1 is the minimum spacing, and the change from the third spacing H3 to the first spacing H1 is a change with equal difference gradient, that is, a uniform change, for example, the difference between the two adjacent spacing is a constant value ΔH. For another example, the change from the third spacing H3 to the first spacing H1 is a change with unequal difference gradient, that is, a non-uniform change, and the difference between the two adjacent spacing is a non-constant value, for example, ΔH1, ΔH2 . . . ΔHn. Comparing these two schemes, the first scheme can reduce the design difficulty. However, in the case that the two schemes achieve the same amount of frame reduction, the display abnormal generated in the first scheme is larger than those generated in the second scheme and is more likely to be observed by the human eyes. The second scheme needs to be adjusted according to the actual situation of the product, such as ΔH1~ΔHn are set to decrease in arithmetic sequence, the more adjacent to the edge, the faster the change, in the same frame compression amount, this way can be easier to bend the drive circuit compression region to a side through a curved surface and other ways, which is not easy to be observed by the human eyes.

In FIG. 1 and FIG. 10, the connection between the signal connection line W1-WN and the data line DL1-DLN are taken as an example, it can be understood that in other embodiments, other signal connection lines may also be provided and configured to be connected with other signal lines, such as a power supply line ELVDD, a ground line ELVSS, in the display region AA. Because these signal connection lines are arranged in a similar way to the signal connection line W, they will not be described in detail here.

Figure 11:
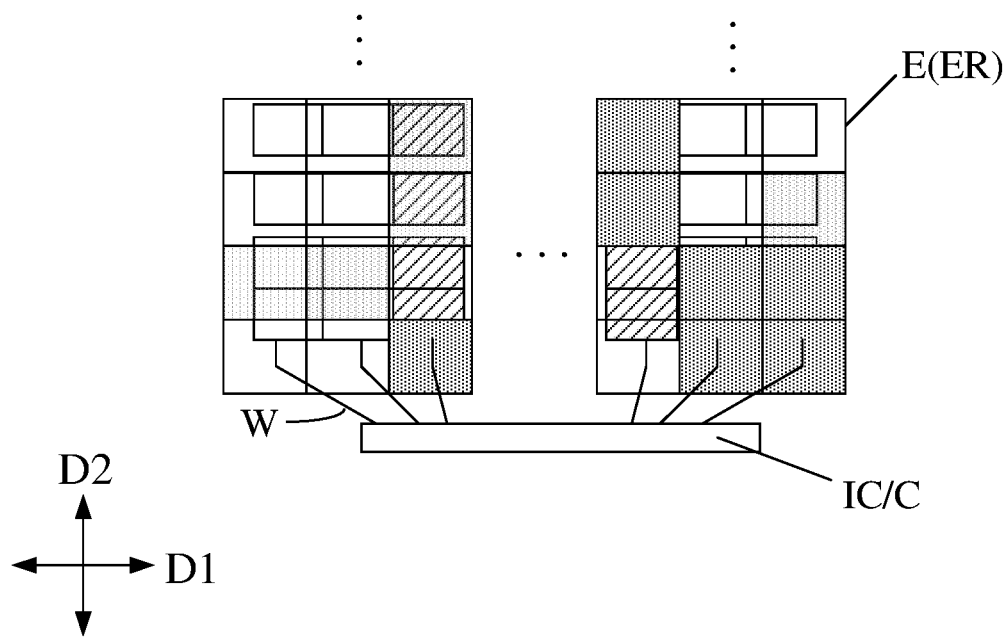
FIG. 11 is a schematic partial structure diagram of a sub-drive structure and a light-emitting structure array of the display substrate of FIG. 10.

FIG. 11 is a schematic partial structure diagram of a sub-drive structure and a light-emitting structure array of the display substrate of FIG. 10. The light-emitting structure layer in FIG. 11 is the same as the light-emitting structure layer in FIG. 1, and is also provided above the driving structure layer; for example, the light-emitting structure layer includes a light-emitting structure array ER, and the light-emitting structure array ER covers a plurality of rows of sub-drive structures.

As shown in FIG. 10, because the plurality of signal connection lines W are inwardly moved into the display region AA, such that the orthographic projection of at least part of the signal connection line W on the base substrate 100 is within the display region AA.

As shown in FIG. 11, the orthographic projection of at least part of the signal connection line W on the base substrate 100 overlaps with the orthographic projection of the light-emitting structure layer on the base substrate 100.

In the above embodiments of the present disclosure, after the formation of the circuit vacant region or the signal-line vacant region, the position of the drive circuits in the drive circuit array may be changed, in this case, the width of the light-emitting structure in the first direction D1 is greater than the width of the drive circuit in the first direction D1, so that the light-emitting region covers the region where the drive circuit array is located.

In the above embodiments of the present disclosure, in order to ensure the luminescence control of the light-emitting structure, after the dummy circuit is removed, the connection between each drive circuit and its corresponding light-emitting structure is retained, for example, the two are connected together by extending the conductive line.

Figure 12:
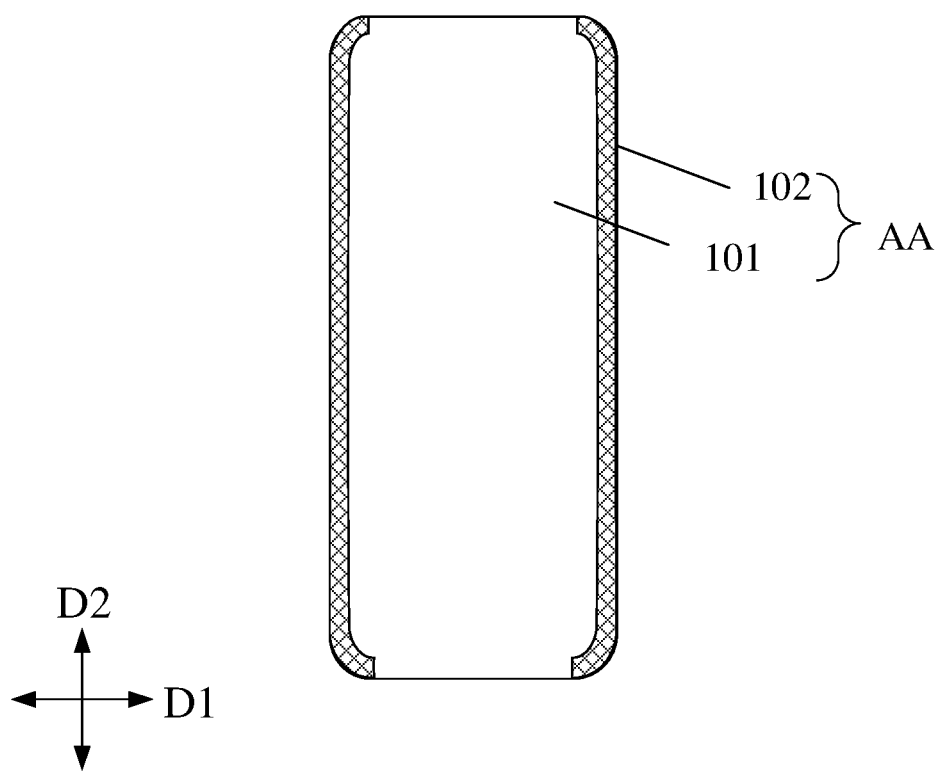
FIG. 12 is a schematic diagram of a display region of a display substrate provided by an embodiment of the present disclosure.

FIG. 12 is a schematic diagram of a display region of a display substrate provided by an embodiment of the present disclosure. As shown in FIG. 12, the display region AA includes a middle region 101 and an edge region 102, the edge region is adjacent to the peripheral region along the first direction D1. For example, at least part of the dummy circuits in the dummy circuit array located in the edge region 102 is configured to be removed, and the dummy circuit located in the middle region 101 is configured to remain, this may reduce the impact on the existing layout of the drive circuit array and the dummy circuit array in the middle region 101.

In the embodiment of the present disclosure, while the removed dummy circuits are one or more columns of dummy circuits, the display region has the following distribution: the light-emitting structure layer includes m×n light-emitting structures, the driving structure layer includes m×n drive circuits and m×A dummy circuits. That is to say, in each row of pixels in the display region, every n drive circuits are provided with A dummy circuits, in other words, every n columns of drive circuits are provided with A columns of dummy circuits. For example, m is an integer greater than or equal to 1, A is an integer greater than or equal to 1, and n is greater than or equal to 2 and less than or equal to 8.

In this case, the drive circuit X has a width x in the first direction D1, the dummy circuit R has a width r in the first direction D1, and the light-emitting structure E has a width e in the first direction D1, then, e×n=x×n+r×A. In the embodiment of the present disclosure, the width r of the dummy circuit R and the width x of the drive circuit X may be equal or unequal to each other. In the case that the two are equal, it is conducive to reducing the design difficulty of the drive circuit and the dummy circuit, and thus simplifying the manufacturing process. In the case that the width r of the dummy circuit R is equal to the width x of the drive circuit X, the width x of each drive circuit X is: x=(c×n)÷(n+A).

Figure 13:
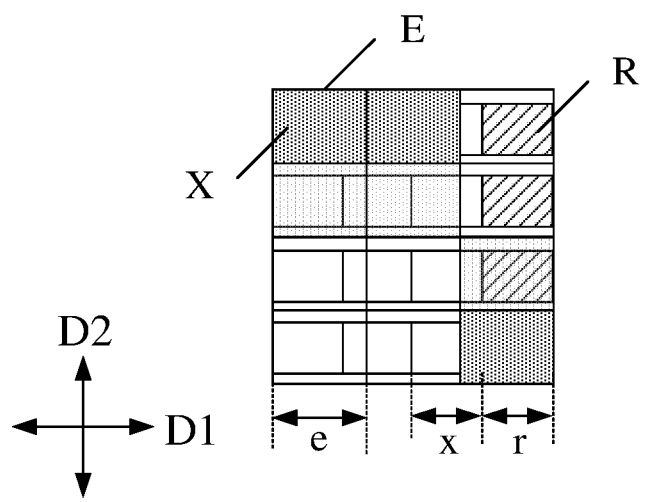
FIG. 13 is a schematic partial structure diagram of a drive structure array and a light-emitting structure array located in a middle region of a display region of the embodiment of the present disclosure.

FIG. 13 is a schematic partial structure diagram of a drive structure array and a light-emitting structure array located in a middle region of a display region of the embodiment of the present disclosure. For example, FIG. 13 is a schematic partial structure diagram of the middle region of the display region of FIG. 10. As shown in FIG. 13, 4×3 light-emitting structures E, 4×3 drive circuits X, 4×1 dummy circuits R are provided, and the dummy circuits have no drive function. In the first direction D1, the width x of the drive circuit X is less than the width e of the light-emitting structure E. Taking the case that every 3 columns of drive circuits are provided with one column of dummy circuits R as an example, the total width of the three light-emitting structures E is equal to the sum of the total width of the three drive circuits X and the width of one dummy circuit R. In the case that the width r of the dummy circuit R is equal to the width x of the drive circuit X, the width x of each drive circuit X is: x=(e×3)÷(3+1). It is understood that the total numbers of light-emitting structures, drive circuits and dummy circuits described above are only illustrative, and other numbers may be adopted, and the embodiment of the present disclosure is not limited to this.

In the above embodiments of the present disclosure, by removing part of the dummy circuits, the arrangement of the drive circuits is adjusted duo to the drive circuits inwardly moved, so that there is no drive circuit under the portions of the light-emitting structure layer located at the left and right edges of the display region (i.e., a circuit vacant region is formed), and the peripheral circuit, such as the gate drive circuit, can be placed in the light-emitting region to reduce the left and right frames of the display substrate. Further, by adjusting the vertical spacing of the plurality of rows sub-drive structures, the drive circuits located at the lower edge of the display region are inwardly moved to form a signal-line vacant region in the drive structure layer, and the peripheral circuit, such as the signal connection line, can be placed in the light-emitting region to reduce the lower frame of the display substrate. In this way, the left or right frame of the display substrate provided by the embodiment of the present disclosure may be reduced by about 0.5~1 mm, and the lower frame may be reduced by 0.2~0.5 mm.

Figure 14:
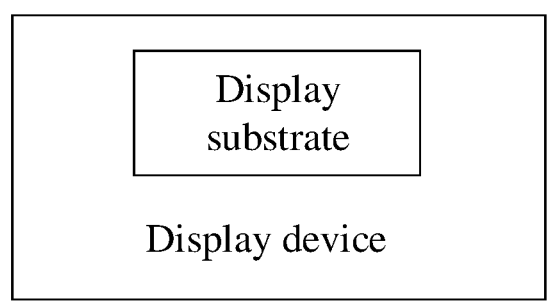
FIG. 14 is a schematic structure diagram of a display device provided by an embodiment of the present disclosure.

FIG. 14 is a schematic structure diagram of a display device provided by an embodiment of the present disclosure. As shown in FIG. 14, the embodiment of the present disclosure further provides a display device including the display substrate described in any one of the above embodiments. The display device provided by the embodiment of the present disclosures may have various types, such as organic light-emitting diode (OLED) display devices. The display device includes, but is not limited to, a notebook computer, a desktop computer, a tablet computer, a mobile phone, a digital photo frame, an e-book, a micro projector, a navigator, a digital television, a mobile television, a billboard and the like, or other products with a display function.

Figure 15:
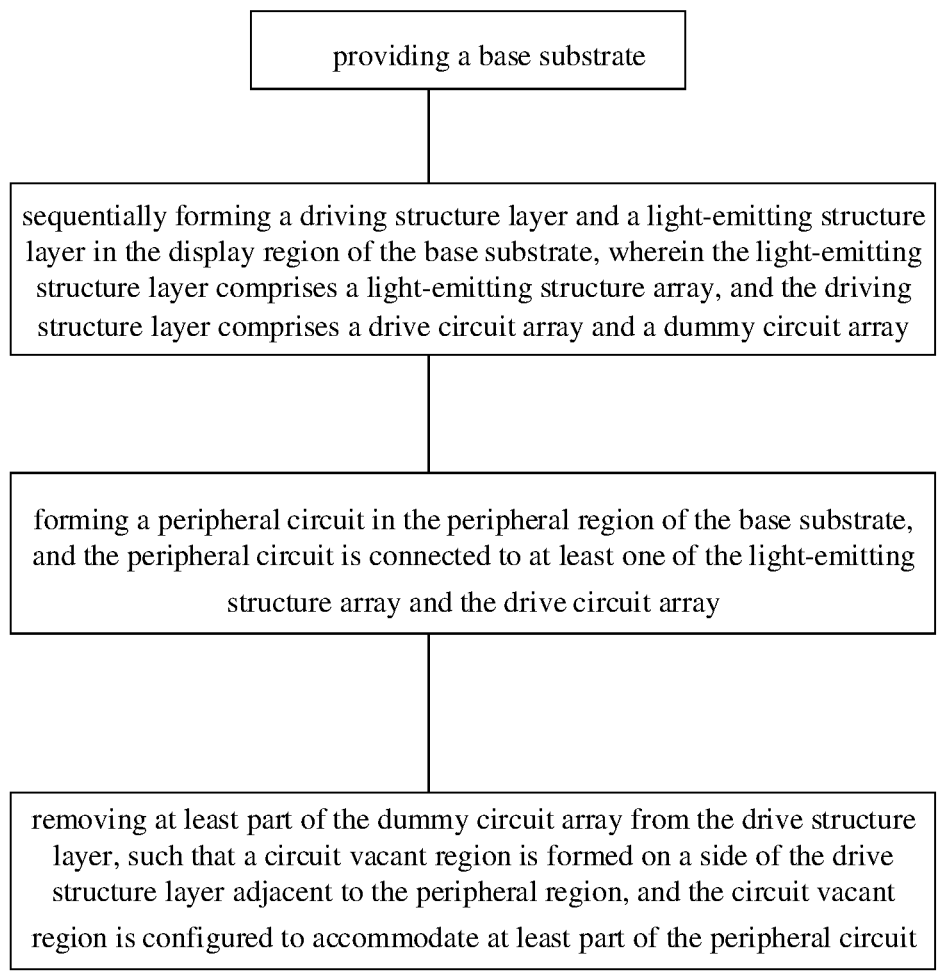
FIG. 15 is a flowchart of a manufacturing method of a display substrate provided by an embodiment of the present disclosure.

FIG. 15 is a flowchart of a manufacturing method of a display substrate provided by an embodiment of the present disclosure. As shown in FIG. 15, the embodiment of the present disclosure further provides a manufacturing method for a display substrate shown in FIG. 1, the display substrate includes a display region AA and a peripheral region PA located on at least one side of the display region AA, the manufacturing method includes:

Step 100: providing a base substrate 100;

Step 200: sequentially forming a drive structure layer 200 and a light-emitting structure layer 300 includes a light-emitting structure array ER, the driving structure layer 200 includes a drive circuit array XR and a dummy circuit array YR;

Step 300: forming a peripheral circuit C in the peripheral region PA of the base substrate 100, wherein the peripheral circuit C is connected to at least one of the light-emitting structure array ER and the drive circuit array XR;

Step 400: removing at least part of the dummy circuit array YR from the drive structure layer 200, such that a circuit vacant region EVA is formed on a side of the drive structure layer 200 adjacent to the peripheral region PA, wherein the circuit vacant region EVA is configured to accommodate at least part of the peripheral circuit C.

In the manufacturing method provided by the embodiment of the present disclosure, by removing the at least part of the dummy circuit array in the drive structure layer located in the display region, the circuit vacant region is formed on the side of the drive structure layer adjacent to the peripheral region, thereby providing a space to accommodate the part of the peripheral circuit, so that the part of the peripheral circuit originally located in the peripheral region is provided in the display region, thereby reducing the space occupied by the peripheral circuit at the frame of the display substrate and realizing a narrow frame design.

For example, in the above manufacturing method, the drive circuit array includes a drive circuit subarray; the dummy circuit array includes a dummy circuit subarray; the dummy circuit subarray is located between the peripheral region and the drive circuit subarray in a direction parallel to the base substrate; in this case, step 400 includes:

Step 402: removing at least part of the dummy circuit subarray on a side adjacent to the peripheral region to form a circuit vacant region.

For example, in the above manufacturing method, the drive circuit array includes a drive circuit subarray; the dummy circuit array includes a dummy circuit subarray; the drive circuit subarray is located between the peripheral circuit and the dummy circuit subarray in a direction parallel to the base substrate; in this case, step 400 includes:

Step 403: removing at least part of the dummy circuit subarray; moving the drive circuit subarray along a direction parallel to the base substrate and adjacent to the dummy circuit subarray, so that at least part of the drive circuit subarray replace at least part of the dummy circuit subarray being removed, thereby forming the circuit vacant region on the side of the drive structure layer adjacent to the peripheral region.

For example, in the above manufacturing method, the dummy circuit subarray includes a plurality of rows of dummy circuits provided in a direction parallel to the base substrate, in step 402 or step 403, the removing at least part of the dummy circuit subarrays includes:

Step 404: removing at least one row of dummy circuits in the plurality of rows of dummy circuits.

For example, in the above manufacturing method, the dummy circuit array includes a plurality of dummy circuit subarrays provided in a direction parallel to the base substrate; in this case, in step 402 or step 403, the removing at least part of the dummy circuit subarrays includes:

Step 405: removing at least part of the dummy circuit subarray, which is the most adjacent to the peripheral region in the direction parallel to the base substrate, of the plurality of dummy circuit subarrays.

For example, in the above manufacturing method, the plurality of dummy circuit subarrays along the direction parallel to the base substrate includes a first dummy circuit subarray adjacent to the peripheral region and a second dummy circuit subarray far away from the peripheral region. The first dummy circuit subarray and the second dummy circuit subarray both include a plurality of dummy circuits; the circuit vacant region includes the first sub-vacant area and the second sub-vacant area; in this case, step 405 further includes:

Step 4061: removing all dummy circuits in the first dummy circuit subarray to form the first sub-vacant region;

Step 4062: removing at least part of the plurality of dummy circuits in the second dummy circuit subarray to form the second sub-vacant region; wherein the second sub-vacant region is farther away from the peripheral region than the first sub-vacant area in the direction parallel to the base substrate.

For example, in the above manufacturing method, the total number of dummy circuits removed in the second dummy circuit subarray is less than the total number of dummy circuits removed in the first dummy circuit subarray.

For example, in the above manufacturing method, the drive circuit array includes a plurality of drive circuit subarrays provided along a direction parallel to the base substrate, and the plurality of drive circuit subarrays includes a first drive circuit subarray located between the first dummy circuit subarray and the second dummy circuit subarray in the direction parallel to the base substrate; in this case, step 4062 further includes:

Step 408: moving the first drive circuit subarray along a direction parallel to the base substrate and adjacent to the second dummy circuit subarray, so that at least part of the first drive circuit subarray replaces the at least part of the plurality of the dummy circuit being removed in the second dummy circuit subarray to form the second sub-vacant region.

For example, in the above manufacturing method, the dummy circuit subarray most adjacent to the peripheral region includes at least two columns of dummy circuits provided along the direction parallel to the base substrate, the at least two columns of dummy circuits includes a first column of dummy circuits adjacent to the peripheral region and a second column of dummy circuits far away from the peripheral region; in this case, step 405 further includes: removing the first column of dummy circuits, and retaining all the second row of dummy circuits.

For example, in the above manufacturing method, the display region includes a first side and a second side provided opposite to each other in a first direction, the first direction is parallel to the base substrate; the peripheral circuit includes a first peripheral subcircuit located on the first side and a second peripheral subcircuit located on the second side; a plurality of dummy circuit subarrays includes a third dummy circuit subarray most adjacent to the first peripheral subcircuit in the first direction and a fourth dummy circuit subarray most adjacent to the second peripheral subcircuit in the first direction; the manufacturing method further includes:

Step 501: removing at least part of the third dummy circuit subarray, such that a first circuit vacant region is formed on the side of the driving structure layer adjacent to the first peripheral subcircuit, and the first circuit vacant region is configured to accommodate at least part of the first peripheral subcircuit;

Step 502: removing at least part of the fourth dummy circuit subarray, such that a second circuit vacant is formed on the side of the driving structure layer adjacent to the second peripheral subcircuit, and the second circuit vacant region is configured to accommodate at least part of the second peripheral subcircuit.

For example, in the above manufacturing method, the first peripheral subcircuit includes a first gate drive circuit, and the first gate drive circuit is provided in the first circuit vacant region; the second peripheral subcircuit includes a second gate drive circuit, and the second gate drive circuit is provided in the second vacant region; the first gate drive circuit and the second gate drive circuit are configured to provide gate scan signals to the drive circuit array.

For example, in the above manufacturing method, the drive circuit array includes a plurality of drive circuit subarrays provided along a direction parallel to the base substrate, and at least one of the plurality of drive circuit subarray is provided between two adjacent dummy circuit subarrays in the plurality of dummy circuit subarrays.

For example, in the above manufacturing method, the orthographic projection of at least part of the peripheral circuit on the base substrate is within the display region and overlaps with the orthographic projection of the light-emitting structure layer on the base substrate.

For example, in the above manufacturing method, the drive structure layer includes a plurality of rows of sub-drive structures arranged along a second direction, each row of sub-drive structures includes a drive circuit and a dummy circuit arranged in the first direction, wherein the drive circuit is part of the drive circuit array, the dummy circuit is part of the dummy circuit array, the first direction and the second direction are parallel to the base substrate and perpendicular to each other. The peripheral region includes a chip region provided on one side of the display region and a signal connection region provided between the display region and the chip region in the second direction; The peripheral circuit further includes a signal connection line located in the signal connection region, the signal connection line is configured to be connected with the signal line in the display region, and the signal line is connected to at least one of the light-emitting structure array and the drive circuit array. At least part of the plurality of rows of sub-drive structures are provided with unequal spacings in the second direction, so that a signal-line vacant region is formed on the side of the drive circuit layer adjacent to the signal connection region, and the signal-line vacant region is configured to accommodate at least part of the signal connection line.

For example, in the above manufacturing method, in the at least part of the plurality of rows of sub-drive structures, every two adjacent rows of sub-drive structures have a spacing in the second direction, and a plurality of spacings gradually decreases in the direction adjacent to the signal connection region.

For example, in the above manufacturing method, in the at least part of the plurality of rows of sub-drive structures, a maximum spacing is provided between two rows of sub-drive structures farthest from the signal connection region along the second direction, and a minimum spacing is provided between two rows of sub-drive structures most adjacent to the signal connection region along the second direction; the plurality of spacings are reduced from the maximum spacing to the minimum spacing with an equal or unequal difference gradient.

For example, in the above manufacturing method, the orthographic projection of at least part of the signal connection line on the base substrate is within the display region, and overlaps with the orthographic projection of the light-emitting structure layer on the base substrate.

For example, in the above manufacturing method, the light-emitting structure array includes a plurality of light-emitting structures provided along a direction parallel to the base substrate; the drive circuit array includes a plurality of drive circuits arranged in the direction parallel to the base substrate; the plurality of light-emitting structures and the plurality of drive circuits are one-to-one connected to each other, and in the direction parallel to the base substrate, the width of each light-emitting structure is greater than the width of each drive circuit.

For example, in the above manufacturing method, the light-emitting structure layer includes m×n light-emitting structures, the driving structure layer includes m×n drive circuits and m×A dummy circuits, wherein m is an integer greater than or equal to 1, A is an integer greater than or equal to 1, and n is greater than or equal to 2 and less than or equal to 8.

For example, in the above manufacturing method, the drive circuit has a width x, the dummy circuit R has a width r, and the light-emitting structure E has a width e, and the relationship between them is as follows: e×n=x×n+r×A. In the case that r=x, x=(e×n)÷(n+A).

The various components mentioned in the above manufacturing method may refer to the components in the above embodiments, which will not be repeated herein. As a result of the same arrangement, the manufacturing method of the display substrate provided in the present disclosure also has the beneficial effect mentioned in the above embodiments.

In the disclosure, the following should be noted:
(1) The accompanying drawings involve only the structure(s) in connection with the embodiment(s) of the present disclosure, and other structure(s) can be referred to common design(s).
(2) For the purpose of clarity only, in accompanying drawings for illustrating the embodiment(s) of the present disclosure, the thickness and a size of a layer or area may be enlarged or narrowed, that is, the drawings are not drawn in a real scale.
(3) In case of no conflict, features in one embodiment or in different embodiments can be combined as a new embodiment.

The above described are only specific embodiments of the present disclosure, and the scope of the present disclosure is not limited to this. For those skilled in the art, various changes and alternations may be readily contemplated without departing from the technical scope of the present disclosure, and all of these changes and alternations shall fall within the scope of the present disclosure. Therefore, the scope of the present disclosure shall be defined by the scope of the claims.

The invention claimed is:

1. A display substrate, comprising: a display region and a peripheral region provided on at least one side of the display region, the display substrate comprising:
    a base substrate;
    a driving structure layer and a light-emitting structure layer, sequentially stacked on the base substrate and provided in the display region, the light-emitting structure layer comprising a light-emitting structure array, the driving structure layer comprising a drive circuit array and a dummy circuit array; and
    a peripheral circuit, on the base substrate and provided in the peripheral region, the peripheral circuit being connected to at least one of the light-emitting structure array and the drive circuit array;
    wherein at least part of the dummy circuit array is configured to be removed from the drive structure layer, such that a circuit vacant region is formed on a side of the drive structure layer adjacent to the peripheral region, and the circuit vacant region is configured to accommodate at least part of the peripheral circuit.

2. The display substrate according to claim 1, wherein:
    the drive circuit array comprises a drive circuit subarray;
    the dummy circuit array comprises a dummy circuit subarray;
    the dummy circuit subarray is provided between the peripheral region and the drive circuit subarray in a direction parallel to the base substrate,
    wherein at least part of the dummy circuit subarray on a side being adjacent to the peripheral region is configured to be removed to form the circuit vacant region.

3. The display substrate according to claim 2, wherein:
the dummy circuit subarray comprises a plurality of lines of dummy circuits provided in the direction parallel to the base substrate, and the at least part of the dummy circuit subarray being removed comprises at least one line of dummy circuits in the plurality of columns of dummy circuits.

4. The display substrate according to claim 2, wherein:
the dummy circuit array comprises a plurality of dummy circuit subarrays provided in the direction parallel to the base substrate;
wherein, in the plurality of dummy circuit subarrays, at least part of the dummy circuit subarray most adjacent to the peripheral region is configured to be removed along the direction parallel to the base substrate.

5. The display substrate according to claim 4, wherein:
the plurality of dummy circuit subarrays in the direction parallel to the base substrate comprises a first dummy circuit subarray adjacent to the peripheral region and a second dummy circuit subarray far away from the peripheral region, the first dummy circuit subarray and the second dummy circuit subarray both comprise dummy circuits;
the circuit vacant region comprises a first sub-vacant region and a second sub-vacant region;
all the dummy circuits in the first dummy circuit subarray are configured to be removed to form the first sub-vacant region;
at least part of the dummy circuits in the second dummy circuit subarray is configured to be removed to form the second sub-vacant region;
the second sub-vacant region is farther away from the peripheral region than the first sub-vacant region along the direction parallel to the base substrate.

6. The display substrate according to claim 5, wherein a total number of dummy circuits being removed in the second dummy circuit subarray is less than a total number of dummy circuits being removed in the first dummy circuit subarray.

7. The display substrate according to claim 5, wherein:
the drive circuit array comprises a plurality of drive circuit subarrays provided along the direction parallel to the base substrate, the plurality of drive circuit subarrays comprising a first drive circuit subarray provided between the first dummy circuit subarray and the second dummy circuit subarray in the direction parallel to the base substrate;
the first drive circuit subarray is configured to be moved along the direction parallel to the base substrate and adjacent to the second dummy circuit subarray, so that at least part of the first drive circuit subarray replaces the at least part of the dummy circuit being removed in the second dummy circuit subarray to form the second sub-vacant region.

8. The display substrate according to claim 4, wherein the dummy circuit subarray most adjacent to the peripheral region comprises at least two lines of dummy circuits provided along the direction parallel to the base substrate, and the at least two lines of dummy circuits comprising a first line of dummy circuits adjacent to the peripheral region and a second line of dummy circuits far away from the peripheral region;
all the first line of dummy circuits is configured to be removed, and all the second line of dummy circuits is configured to be retained.

9. The display substrate according to claim 4, wherein:
the display region comprises a first side and a second side provided opposite to each other in the first direction, the first direction parallels to the base substrate;
the peripheral circuit comprises a first peripheral subcircuit provided on the first side and a second peripheral subcircuit provided on the second side;
the plurality of dummy circuit subarrays comprising a third dummy circuit subarray most adjacent to the first peripheral subcircuit in the first direction and a fourth dummy circuit subarray most adjacent to the second peripheral subcircuit;
at least part of the third dummy circuit array is configured to be removed such that a first circuit vacant region is formed on a side of the driving structure layer adjacent to the first peripheral subcircuit, and the first circuit vacant region is configured to accommodate at least part of the first peripheral subcircuit;
at least part of the fourth dummy circuit array is configured to be removed, such that a second circuit vacant region is formed on a side of the driving structure adjacent to the second peripheral subcircuit, and the second circuit vacant region is configured to accommodate at least part of the second peripheral subcircuit.

10. The display substrate according to claim 9, wherein the first peripheral subcircuit comprises a first gate drive circuit, the first gate drive circuit is provided in the first circuit vacant region;
the second peripheral subcircuit comprises a second gate drive circuit, the second gate drive circuit is provided in the second circuit vacant region;
the first gate drive circuit and the second gate drive circuit are configured to provide a gate scanning signal to the drive circuit array.

11. The display substrate according to claim 4, wherein:
the drive circuit array comprises a plurality of drive circuit subarrays provided in the direction parallel to the base substrate, and at least one drive circuit subarray in the plurality of drive circuit subarray is provided between two adjacent dummy circuit subarrays in the plurality of dummy circuit subarrays.

12. The display substrate according to claim 1, wherein:
the drive circuit array comprises a drive circuit subarray;
the dummy circuit array comprises a dummy circuit subarray;
the drive circuit subarray is provided between the peripheral circuit and the dummy circuit subarray in a direction parallel to the base substrate;
wherein at least part of the dummy circuit subarray is configured to be removed; the drive circuit subarray is configured to be moved along the direction parallel to the base substrate and adjacent to the dummy circuit subarray, so that at least part of the drive circuit subarray replaces at least part of the dummy circuit subarray being removed, and the circuit vacant region is formed on the side of the drive structure layer adjacent to the peripheral region.

13. The display substrate according to claim 1, wherein:
an orthographic projection of the at least part of the peripheral circuit on the base substrate is within the display region and overlaps with an orthographic projection of the light-emitting structure layer on the base substrate.

14. The display substrate according to claim 1, wherein:
the drive structure layer comprises a plurality of lines of sub-drive structures provided in a second direction, each line of the sub-drive structure comprises a drive circuit and a dummy circuit provided in the first direction, wherein the drive circuit is part of the drive circuit array, the dummy circuit is part of the dummy circuit array, the first direction and the second direction are parallel to the base substrate and perpendicular to each other;

the peripheral region comprises a chip region provided on one side of the display region and a signal connection region provided between the display region and the chip region in the second direction;

the peripheral circuit further comprises a signal connection line provided in the signal connection region, the signal connection line is configured to be connected with a signal line in the display region, the signal line is connected to at least one of the light-emitting structure array and the drive circuit array;

wherein at least part lines of sub-drive structures in the plurality of sub-drive structures are provided with unequal spacing in the second direction, such that a signal-line vacant region is formed on a side of the drive circuit layer adjacent to the signal connection region, and the signal-line vacant region is configured to accommodate at least part of the signal connection line.

15. The display substrate according to claim 14, wherein:
in at least part lines of sub-drive structures, every two adjacent lines of sub-drive structures have a spacing in the second direction, and a plurality of the spacing gradually decrease in the direction adjacent to the signal connection region.

16. The display substrate according to claim 15, wherein:
in the at least part lines of sub-drive structures, a maximum spacing is provided between two lines of sub-drive structures farthest from the signal connection region in the second direction, and a minimum spacing is provided between two lines of sub-drive structures most adjacent to the signal connection region in the second direction;
the plurality of spacing is reduced from the maximum spacing to the minimum spacing with an equal or unequal difference gradient.

17. The display substrate according to claim 14, wherein:
an orthographic projection of the at least part of the signal connection line on the base substrate is within the display region and overlaps with an orthographic projection of the light-emitting structure layer on the base substrate.

18. The display substrate according to claim 1, wherein:
the light-emitting structure array comprises a plurality of light-emitting structures provided in a direction parallel to the base substrate;

the drive circuit array comprises a plurality of drive circuits provided in the direction parallel to the base substrate;

the plurality of light-emitting structures and the plurality of drive circuits are one-to-one connected with each other, and in the direction parallel to the base substrate, a width of each light-emitting structure is greater than a width of each of the drive circuits.

19. A display device, comprising: a display substrate, the display substrate comprising: a display region and a peripheral region provided on at least one side of the display region, the display substrate comprising:
a base substrate;
a driving structure layer and a light-emitting structure layer, sequentially stacked on the base substrate and provided in the display region, the light-emitting structure layer comprising a light-emitting structure array, the driving structure layer comprising a drive circuit array and a dummy circuit array; and
a peripheral circuit, on the base substrate and provided in the peripheral region, the peripheral circuit being connected to at least one of the light-emitting structure array and the drive circuit array;
wherein at least part of the dummy circuit array is configured to be removed from the drive structure layer, such that a circuit vacant region is formed on a side of the drive structure layer adjacent to the peripheral region, and the circuit vacant region is configured to accommodate at least part of the peripheral circuit.

20. A manufacturing method of a display substrate, the display substrate comprises a display region and a peripheral region provided on at least one side of the display region, the manufacturing method comprising:
providing a base substrate;
sequentially forming a driving structure layer and a light-emitting structure layer in the display region of the base substrate, wherein the light-emitting structure layer comprises a light-emitting structure array, and the driving structure layer comprises a drive circuit array and a dummy circuit array;
forming a peripheral circuit in the peripheral region of the base substrate, and the peripheral circuit is connected to at least one of the light-emitting structure array and the drive circuit array;
removing at least part of the dummy circuit array from the drive structure layer, such that a circuit vacant region is formed on a side of the drive structure layer adjacent to the peripheral region, and the circuit vacant region is configured to accommodate at least part of the peripheral circuit.

* * * * *